(12) United States Patent
Dong et al.

(10) Patent No.: US 11,587,988 B2
(45) Date of Patent: Feb. 21, 2023

(54) PREPARATION METHOD OF COLOR FILM LAYER, DISPLAY SUBSTRATE AND PREPARATION METHOD THEREOF

(71) Applicant: BOE TECHNOLOGY GROUP CO., LTD., Beijing (CN)

(72) Inventors: Yongfa Dong, Beijing (CN); Kuanta Huang, Beijing (CN); Shengji Yang, Beijing (CN); Pengcheng Lu, Beijing (CN); Qing Wang, Beijing (CN); Hui Tong, Beijing (CN); Yu Wang, Beijing (CN); Xiaobin Shen, Beijing (CN); Xiong Yuan, Beijing (CN); Dongsheng Li, Beijing (CN); Rongyuan Zou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 329 days.

(21) Appl. No.: 16/958,931

(22) PCT Filed: Aug. 27, 2019

(86) PCT No.: PCT/CN2019/102901
§ 371 (c)(1),
(2) Date: Jun. 29, 2020

(87) PCT Pub. No.: WO2021/035550
PCT Pub. Date: Mar. 4, 2021

(65) Prior Publication Data
US 2021/0066400 A1    Mar. 4, 2021

(51) Int. Cl.
*H01L 27/32* (2006.01)
*H01L 51/56* (2006.01)
(Continued)

(52) U.S. Cl.
CPC .............. *H01L 27/322* (2013.01); *C09D 5/00* (2013.01); *C09D 7/41* (2018.01); *C09D 133/04* (2013.01);
(Continued)

(58) Field of Classification Search
CPC .............. H01L 27/322; H01L 27/3244; H01L 51/56; G02B 1/04; G02B 5/201
See application file for complete search history.

(56) References Cited

U.S. PATENT DOCUMENTS

2003/0107314 A1  6/2003  Urabe et al.
2005/0269942 A1  12/2005  Ahn et al.
(Continued)

FOREIGN PATENT DOCUMENTS

CN  1426269 A  6/2003
CN  1976053 A  6/2007

OTHER PUBLICATIONS

The Extended European Search Report dated Aug. 22, 2022; Appln. No. 19933235.4.

*Primary Examiner* — Anne M Hines

(57) ABSTRACT

A preparation method of a color film layer, a display substrate and a preparation method thereof. The display substrate includes a bearing layer and repeating units, each repeating unit including a green film layer, a red film layer and a blue film layer, which are provided on the bearing layer and directly contacting a first surface of the bearing layer. On a plane parallel to the first surface of the bearing layer, in each repeating unit, the red film layer is provided on a first side of the green film layer, the blue film layer is provided on a second side of the green film layer opposite to the first side; one of the red film layer and the blue color film
(Continued)

layer covers part of the green film layer; one part of the green film layer does not overlap with the red film layer and the blue film layer.

19 Claims, 8 Drawing Sheets

(51) Int. Cl.
| | |
|---|---|
| *G02B 5/20* | (2006.01) |
| *G02B 1/04* | (2006.01) |
| *C09D 133/04* | (2006.01) |
| *C09D 7/41* | (2018.01) |
| *C09D 5/00* | (2006.01) |
| *C08K 5/00* | (2006.01) |
| *C08K 5/56* | (2006.01) |
| *C08K 5/3417* | (2006.01) |

(52) U.S. Cl.
CPC ............... *G02B 1/04* (2013.01); *G02B 5/201* (2013.01); *H01L 27/3244* (2013.01); *H01L 51/56* (2013.01); *C08K 5/0041* (2013.01); *C08K 5/3417* (2013.01); *C08K 5/56* (2013.01); *H01L 2227/323* (2013.01)

(56) References Cited

U.S. PATENT DOCUMENTS

| | | |
|---|---|---|
| 2007/0123135 A1 | 5/2007 | Tang et al. |
| 2012/0206066 A1 | 8/2012 | Takagi |
| 2015/0236074 A1 | 8/2015 | Akagawa et al. |
| 2017/0236464 A1 | 8/2017 | Koshihara |
| 2018/0138376 A1* | 5/2018 | Koshihara ........... H01L 27/3241 |
| 2018/0197922 A1 | 7/2018 | Song |
| 2018/0277610 A1 | 9/2018 | Kubota et al. |

\* cited by examiner

PREPARATION METHOD OF COLOR FILM LAYER, DISPLAY SUBSTRATE AND PREPARATION METHOD THEREOF

TECHNICAL FIELD

Embodiments of the present disclosure relate to a preparation method of a color film layer, a display substrate, and a preparation method thereof.

BACKGROUND

Organic light-emitting display (OLED) devices have a wide range of applications in the display field due to their advantages, such as self-luminescence, wide viewing angle, and fast response speed. Silicon-based OLED microdisplays are especially widely used, and can be applied to head-mounted video players, head-mounted home theaters, head-mounted virtual reality simulators, head-mounted game player, pilot helmet systems, and head-mounted medical diagnostics System, etc.

The performance of silicon-based OLED microdisplays is better than that of conventional silicon-based liquid crystal microdisplays. Silicon-based OLED microdisplays have the advantages of extremely fast response speed, good low-temperature characteristics, low power consumption, good mechanical properties, and strong shock resistance. The silicon-based OLED microdisplay includes an anode, a cathode, and a functional layer of organic material between the anode and the cathode. The light-emitting process and principle of silicon-based OLED microdisplays are that holes are injected from the anode and electrons are injected from the cathode, and the injected holes and electrons are transferred to the light-emitting center through the carrier transport layer in the functional layer of the organic material, and then the holes and electrons are combined to emit light.

SUMMARY

At least one embodiment of the present disclosure provides a display substrate. The display substrate comprises a bearing layer and a plurality of repeating units. Each of the repeating units comprises a green film layer, a red film layer, and a blue film layer, and the green film layer, the red film layer and the blue film layer are provided on the bearing layer and directly contact a first surface of the bearing layer. On a plane parallel to the first surface of the bearing layer, in each of the repeating units, the red film layer is provided on a first side of the green film layer, and the blue film layer is provided on a second side of the green film layer opposite to the first side; at least one of the red film layer and the blue film layer covers a part of the green film layer; and at least one part of the green film layer does not overlap with the red film layer and the blue film layer.

For example, in the display substrate provided by at least one embodiment of the present disclosure, adhesion of the green film layer is greater than adhesion of the red film layer and adhesion of the blue film layer.

For example, in the display substrate provided by at least one embodiment of the present disclosure, in each of the repeating units, the green film layer is located between the red film layer and the blue film layer, the green film layer and the red film layer do not overlap at least partially, the green film layer and the blue film layer do not overlap at least partially, and the red film layer and the blue film layer do not overlap at all, the blue film layer of at least one repeating unit partially covers the red film layer of an adjacent repeating unit.

For example, in the display substrate provided by at least one embodiment of the present disclosure, in each of the repeating units, the red film layer and a part of the green film layer overlap to form a first overlap region; and the blue film layer and a part of the green film layer overlap to form a second overlap region.

For example, in the display substrate provided by at least one embodiment of the present disclosure, the first overlap region and the second overlap region respectively account for 5%-20% of a total area of the green film layer.

For example, in the display substrate provided by at least one embodiment of the present disclosure, the first overlap region and the second overlap region respectively account for 10% of the total area of the green film layer.

For example, in the display substrate provided by at least one embodiment of the present disclosure, the first overlap region and the second overlap region do not overlap.

For example, in the display substrate provided by at least one embodiment of the present disclosure, a shape of a cross section of the green film layer perpendicular to the bearing layer is a rectangle with rounded corners; a portion of the red film layer overlapping with part of the green film layer is protruded toward a side away from the green film layer; a portion of the blue film layer overlapping with a part of the green film layer is protruded toward a side away from the bearing layer, and a portion of the blue film layer overlapping with the red film layer of the adjacent repeating unit is protruded toward a side away from the bearing layer.

For example, in the display substrate provided by at least one embodiment of the present disclosure, edges of both sides of the blue film layer are convex and a middle portion of the blue film layer is concave; and relative to the bearing layer, a height of the red film layer gradually decreases from an overlap position of the red film layer and the green film layer toward a direction away from the green film layer.

For example, in the display substrate provided by at least one embodiment of the present disclosure, in a first overlap region formed by overlapping the red film layer and the part of the green film layer, a total thickness of a stack of the red film layer and the green film layer is greater than a thickness of a middle region of the red film layer and a thickness of a middle region of the green film layer, and in the first overlap region formed by overlapping the red film layer and the part of the green film layer, a thickness of the red film layer is less than the thickness of the middle region of the red film layer.

For example, in the display substrate provided by at least one embodiment of the present disclosure, in a second overlap region formed by overlapping the blue film layer and the part of the green film, a total thickness of a stack of the blue film layer and the green film layer is respectively greater than a thickness of a middle region of the blue film layer and a thickness of a middle region of the green film layer, and in the second overlap region formed by overlapping the blue film layer and the part of the green film, a thickness of the blue film layer is less than the thickness of the middle region of the blue film layer.

For example, in the display substrate provided by at least one embodiment of the present disclosure, a surface of the blue film layer away from the bearing layer is depressed toward the bearing layer, an orthographic projection of the blue film layer on the bearing layer is a rectangle with rounded corners, and a thickness of an edge region of the blue film layer is less than a thickness of a middle region of the blue film layer.

For example, in the display substrate provided by at least one embodiment of the present disclosure, a surface of the green film layer away from the bearing layer is protruded away from the bearing layer, an orthographic projection of the green film layer on the bearing layer is a rectangle with rounded corners, and a thickness of an edge region of the green film layer is less than a thickness of a middle region of the green film layer.

For example, in the display substrate provided by at least one embodiment of the present disclosure, an orthographic projection of the red film layer on the bearing layer is a rectangle with rounded corners, a thickness of an edge region of the red film layer is less than a thickness of a middle region of the red film layer, and in each of the repeating units, a thickness of the red film layer increases first and then decreases in a direction from the blue film layer to the red film layer.

At least one embodiment of the present disclosure also provides a display substrate. The display substrate comprises: a base substrate; and a light-emitting element and a color film layer sequentially stacked on the base substrate. The color film layer comprises a first color film layer and a second color film layer provided on a side of the light-emitting element away from the base substrate, the second color film layer partially covers the first color film layer, and adhesion of the first color film layer is greater than adhesion of the second color film layer.

For example, the display substrate provided by at least one embodiment of the present disclosure further comprises a third color film layer. The third color film layer partially covers the first color film layer, the second color film layer partially covers the third color film layer; and adhesion of the third color film layer is greater than the adhesion of the second color film layer and less than the adhesion of the first color film layer.

For example, the display substrate provided by at least one embodiment of the present disclosure comprises a display region and a peripheral region surrounding the display region outside. The first color film layer, the second color film layer, and the third color film layer are provided in the display region, the peripheral region is provided with a black matrix. The black matrix comprises a first sub-layer and a second sub-layer that are stacked, the first sub-layer is provided in a same layer and in a same material as one of the first color film layer, the second color film layer, and the third color film layer, and the second sub-layer is provided in a same layer and in a same material as another layer of the first color film layer, the second color film layer, and the third color film layer.

For example, the display substrate provided by at least one embodiment of the present disclosure further comprises a display region and a peripheral region surrounding the display region outside. The first color film layer, the second color film layer, and the third color film layer are provided in the display region, the peripheral region is provided with a black matrix. The black matrix comprises a first sublayer, a second sublayer, and a third sub-layer that are stacked, the first sub-layer is provided in a same layer as the first color film layer, the second sub-layer is provided in a same layer as the second color film layer, and the third sub-layer is provided in a same layer as the third color film layer.

For example, in the display substrate provided by at least one embodiment of the present disclosure, the display region comprises a plurality of pixel units, each of the pixel units comprises the first color film layer, the second color film layer, and the third color film layer, in each of the pixel units, the first color film layer is located between the second color film layer and the third color film layer, the first color film layer and the second color film layer do not overlap at least partially, the first color film layer and the third color film layer do not overlap at least partially, and the second color film layer and the third color film layer do not overlap at all, the second color film layer of at least one pixel unit partially covers the third color film layer of an adjacent pixel unit.

For example, in the display substrate provided by at least one embodiment of the present disclosure, in each of the pixel units, the second color film layer partially covers the first color film layer to form a first overlap region, the third color film layer partially covers the first color film layer to form a second overlap region, and both the first overlap region and the second overlap region have a function of blocking light.

For example, in the display substrate provided by at least one embodiment of the present disclosure, in the display region, the first color film layer, the second color film layer, and the third color film layer are arranged in an array; and in the peripheral region, the black matrix has a ring-shaped pattern.

For example, the display substrate provided by at least one embodiment of the present disclosure further comprises a filling material and a cover plate provided on a side of the color film layer away from the base substrate.

For example, in the display substrate provided by at least one embodiment of the present disclosure, a material of the base substrate is a silicon-based material.

At least one embodiment of the present disclosure provides a preparation method of a color film layer, the color film layer comprises a plurality of repeating units, and forming each of the repeating units comprises: forming a first color film; and after forming the first color film layer, forming a second color film layer partially covering the first color film layer. Adhesion of the first color film layer is greater than adhesion of the second color film layer; the first color film layers of the plurality of repeating units are formed in a same patterning process, the second color film layers of the plurality of repeating units are formed in a same patterning process, and the third color film layers of the plurality of repeating units are formed in a same patterning process.

For example, in the preparation method provided by at least one embodiment of the present disclosure, air permeability of the second color film layer is greater than air permeability of the first color film layer.

For example, the preparation method provided by at least one embodiment of the present disclosure further comprises after forming the first color film layer and before forming the second color film layer, forming a third color film layer. The third color film layer partially covers the first color film layer, the second color film layer partially covers the third color film layer; adhesion of the third color film layer is greater than the adhesion of the second color film layer and less than the adhesion of the first color film layer.

For example, in the preparation method provided by at least one embodiment of the present disclosure, air permeability of the third color film layer is greater than the air permeability of the first color film layer and less than the air permeability of the second color film layer.

For example, in the preparation method provided by at least one embodiment of the present disclosure, the first color film layer is a green film layer, the second color film layer is a blue film layer, and the third color film layer is a red film layer.

For example, in the preparation method provided by at least one embodiment of the present disclosure, a material of the first color film layer comprises a base material and a first color material; a material of the second color film layer comprises the base material and a second color material; and a material of the third color film layer comprises the base material and a third color material.

For example, in the preparation method provided by at least one embodiment of the present disclosure, the base material comprises propylene glycol monomethyl ether ester, 3-methoxybutyl acetate and acrylic resin; the first color material comprises $C_{32}Cl_{16}CuN_8$, $C_{16}H_{11}N_5O_4$ and auxiliary green pigment; the second color material comprises 2-butanone, phthalocyanine blue and auxiliary blue pigment; and the third color material comprises 2-butanone, $C_{28}H_{16}O_4$, $C_{16}H_9N_5O_6$ and auxiliary red pigment.

For example, in the preparation method provided by at least one embodiment of the present disclosure, by mass percentage, the material of the first color film layer comprises 50 wt %~60 wt % propylene glycol monomethyl ether ester, 20 wt %~25 wt % 3-methoxybutyl acetate, 1 wt %~10 wt % acrylic resin, 5 wt %~11 wt % $C_{32}Cl_{16}CuN_8$, 3 wt %~10 wt % $C_{16}H_{11}N_5O_4$, and 1 wt %~10 wt % auxiliary green pigment; the material of the second color film layer comprises 60 wt %~75 wt % propylene glycol monomethyl ether ester, 9 wt %~14 wt % 3-methoxybutyl acetate, 5 wt %~10 wt % acrylic resin, 0.05 wt %~0.5 wt % 2-butanone, 3 wt %~10 wt % phthalocyanine blue, and 1 wt %~10 wt % auxiliary blue pigment; and the material of the third color film layer comprises 60 wt %~70 wt % propylene glycol monomethyl ether ester, 10 wt %~30 wt % 3-methoxybutyl acetate, 2 wt %~10 wt % acrylic resin, 0.05 wt %~0.5 wt % 2-butanone, 2 wt %~10 wt % $C_{28}H_{16}N_2O_4$, 0.5 wt %~3 wt % $C_{16}H_9N_5O_6$, and 1 wt %~10 wt % auxiliary red pigment.

For example, in the preparation method provided by at least one embodiment of the present disclosure, viscosity of the material of the first color film layer is 8.1 mPa·s to 9.0 mPa·s, and viscosity of the material of the second color film layer is 7.5 mPa·s to 8.0 mPa·s, and viscosity of the material of the third color film layer is 4 mPa·s~4.6 mPa·s.

For example, in the preparation method provided by at least one embodiment of the present disclosure, the viscosity of the material of the first color film layer is 8.4 mPa·s, the viscosity of the material of the second color film layer is 7.8 mPa·s, and the viscosity of the material of the third color film layer is 4.4 mPa·s.

For example, in the preparation method provided by at least one embodiment of the present disclosure, areas of the first color film layer, the second color film layer, and the third color film layer are all less than 20 μm$^2$; and a preparation temperature of the first color film layer, the second color film layer, and the third color film layer is less than 90° C.

For example, in the preparation method provided by at least one embodiment of the present disclosure, forming the first color film, the second color film, and the third color film by a spin coating process, and then forming the first color film layer, the second color film layer, and the third color film layer by performing a patterning process on the first color film, the second color film, and the third color film, respectively.

For example, at least one embodiment of the present disclosure also provides a preparation method of a display substrate, comprising: providing a base substrate; forming a light-emitting element on the base substrate; and forming a color film layer on a side of the light-emitting element away from the base substrate by any one of the preparation methods.

For example, the preparation method provided by at least one embodiment of the present disclosure further comprises, before forming the color film layer, forming a passivation layer on a side of the light-emitting element away from the base substrate; after forming the color film layer, sequentially forming a filling material and a cover plate on a side of the color film layer away from the base substrate.

For example, in the preparation method provided by at least one embodiment of the present disclosure, a material of the base substrate is a silicon-based material.

BRIEF DESCRIPTION OF THE DRAWINGS

In order to clearly illustrate the technical schemes of the embodiments of the disclosure, the drawings of the embodiments will be briefly described in the following. It is apparent that the described drawings are only related to some embodiments of the disclosure and not limitative of the disclosure.

REFERENCE SIGNS

1—silicon substrate; 2—spacer; 3—light-emitting layer and functional layer; 4—thin film package layer; 5—color filter; 6—curing adhesive; 7—glass cover plate; 100—bearing layer; 108—repeating units; 201,3041—first color film; 202,3042—second color film; 203—third color film; 300—display substrate; 101, 301—base substrate; 102—first insulating layer; 302—light-emitting element; 3021, 115—anode; 3022, 116, 105—light-emitting functional layer; 3023, 117—cathode; 303—passivation layer; 200, 304, 119—color film layer; 3043—third color film layer; 305—filling material; 306—cover plate; 10—display region; 12, 20, 140—peripheral region; 50—black matrix; 501—first sublayer; 502—second sublayer; 503—third sublayer; 110—array substrate; 113—silicon substrate; 410—light-emitting element; 420—silicon-based base substrate; 430—pixel circuit; 440—light reflection layer; 450—insulating layer; 451—metal member; 452—via hole; 453—pad; 454—opening; 107, 211—first thin-film package layer; 118—second thin-film package layer; 120—cover plate; 12a—connection electrode region; 121—first dummy region; 122—second dummy region; 103—first electrode pattern; 1030—first electrode; 103a—connection electrode pattern; 103a0—connection electrode; de1—first dummy electrode pattern; de10—first dummy electrode; 106—second electrode; 103b—sensor electrode pattern; 103b0—sensor electrode; de2—second dummy electrode pattern; de20—second dummy electrode; 1211—first dummy sub-region; 1212—second dummy sub-region; 104a—first filling layer; 104c—insulating wrapping layer; 103e—edge first electrode; 104—pixel definition layer; 1040—pixel definition portion; 104b—second filling layer; 104b0—second filling portion; 1043—third filling layer; 10430—third filling portion; 109—conductive pattern; 1091—first conductive portion; 1092—second conductive portion; 1093—third conductive portion; 601—power line; 602—data line; 603—gate insulating layer; 604—first insulating layer; 605—second insulating layer.

DETAILED DESCRIPTION

To make the objectives, technical schemes and advantages clearer, technical schemes of the embodiments will be described in a clearly and fully understandable way in connection with the drawings related to the embodiments of the disclosure. Apparently, the described embodiments are a part but not all of the embodiments of the disclosure. Based on the described embodiments herein, one of ordinary skill in the art can obtain other embodiment(s), without any creative labor, which shall be within the scope of the present disclosure.

Figure 1:
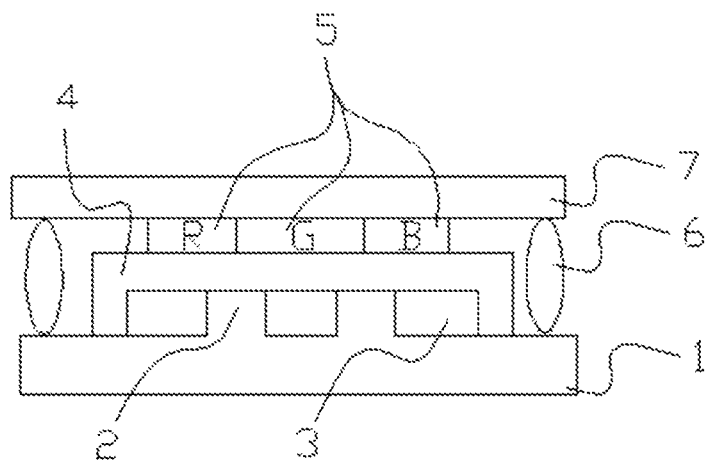
FIG. 1 is a schematic diagram of a cross-sectional structure of a silicon-based OLED microdisplay.

Unless otherwise defined, all the technical and scientific terms used herein have the same meanings as commonly understood by one of ordinary skill in the art to which the present disclosure belongs. The terms, such as "first," "second," or the like, which are used in the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms "connect/connection", "connecting/connected", etc., are not limited to a physical connection or mechanical connection, but may include an electrical connection, directly or indirectly. The terms, "on," "under," "left," "right," or the like are only used to indicate relative position relationship, and when the absolute position of the object which is described is changed, the relative position relationship may be changed accordingly Silicon-based organic light-emitting diode (OLED) microdisplays have a wide range of applications in the display field because of their advantages, such as high integration, small size, ultra-high contrast, and ultra-high PPI display. In fabricating colorized silicon-based OLED micro-displays, generally, thin-film packaging is performed immediately after the preparation of the silicon-based OLED microdisplays, and then color filters are prepared, that is, the color filters are formed directly on the packaged silicon-based OLED microdisplays. For example, FIG. 1 is a schematically cross-sectional structure diagram of a colorized silicon-based OLED microdisplay. As shown in FIG. 1, a silicon-based substrate 1 is provided with a light-emitting layer that emits white light and a functional layer 3 (e.g., a hole injection layer, a hole transport layer, an electron transport layer, and/or an electron injection layer) that plays an auxiliary role, spacers 2 that separate pixels, a thin-film packaging layer 4 provided on the light-emitting layer and the functional layer 3, the color filter 5 provided on the thin-film packaging layer 4, a glass cover 7 provided on the color filter 5, and a curing glue 6 for bonding the silicon-based substrate 1 and the glass cover 7. Because the color filter 5 is formed on the silicon-based OLED microdisplay, a lower temperature (<90° C.) is required in the process of manufacturing the color filter 5, otherwise it will adversely affect the silicon-based OLED microdisplay. At present, the process of preparing large-size color filters 5 under high temperature conditions is relatively mature, while the process of preparing color filters 5 with an area of a few square microns and a thickness of a few microns under the condition that the process temperature is less than 90° C. is not very mature, the problem of poor adhesion between the color filter 5 and the glass cover 7 is likely to occur when the color filter 5 is prepared at a lower temperature, and the problems of uneven thickness of the color filter 5 and severe moiré in the subsequent display process may also occur.

At least one embodiment of the present disclosure provides a preparation method of a color film layer, the color film layer includes a plurality of repeating units, and forming each repeating unit includes: forming a first color film layer; and after forming the first color film layer, forming a second color film layer partially covering the first color film layer; in which the adhesion of the first color film layer is greater than the adhesion of the second color film layer. The first color film layers of the plurality of repeating units are formed in a same patterning process, the second color film layers of the plurality of repeating units are formed in a same patterning process, and the third color film layers of the plurality of repeating units are formed in a same patterning process. The risk of the color film layer peeling off from a bearing layer can be reduced by using this method to prepare the color film layer.

It is to be noted that the adhesion of the first color film layer is greater than the adhesion of the second color film layer, which is relative to the same bearing layer, that is, the first color film layer and the second color film layer are located on the same bearing layer, the adhesion between the first color film layer and the bearing layer is greater than the adhesion between the second color film layer and the bearing layer.

For example, the first color film layer with high adhesion is formed earlier, and the second color film layer with low adhesion is formed later, and the second color film layer with low adhesion partially covers the first color film layer with high adhesion, so that the contact area between the second color film layer with low adhesion and the bearing layer can be decreased. The properties of the first color film layer and the second color film layer are similar. The adhesion between the first color film layer and the second color film layer is greater than the adhesion between the second color film layer and the bearing layer. Compared with the case where the second color film layer does not cover the first color film layer at all, the second color film layer partially covering the first color film layer can reduce the possibility of the first color film layer and the second color film layer peeling off from the bearing layer.

In addition, because the second color film layer has low adhesion, it has good fluidity. In the process of forming the second color film layer, the content of air bubbles on the surface of the entirety of the first color film layer and the second color film layer away from the bearing layer can be reduced, and the uniformity of the film thickness of the entirety of the first color film layer and the second color film layer at the position where the two layers overlap is improved.

Figure 2:
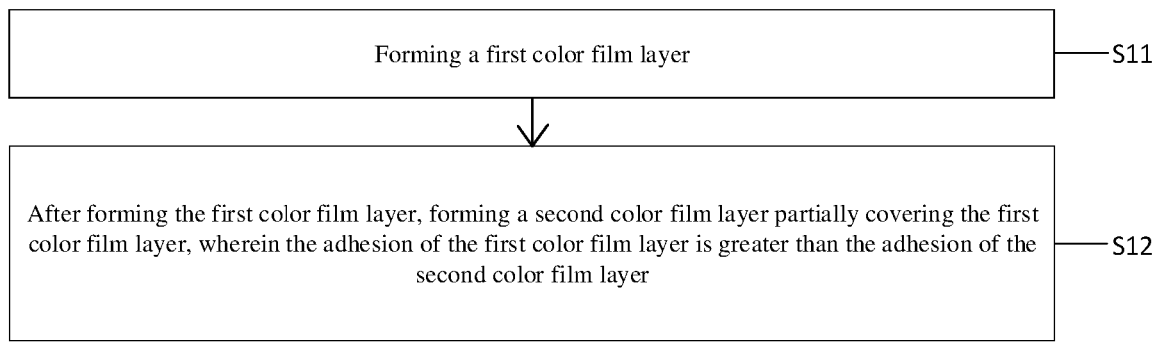
FIG. 2 is a flowchart of a preparation method of each repeating unit of a color film layer provided by an embodiment of the present disclosure.

For example, FIG. 2 is a flowchart of a preparation method of a color film layer according to an embodiment of the present disclosure. As shown in FIG. 2, the color film layer includes a plurality of repeating units, and the preparation method of each repeating unit includes the following steps:

Step S11: forming a first color film layer.

Step S12: after forming the first color film layer, forming a second color film layer partially covering the first color film layer, in which the adhesion of the first color film layer is greater than the adhesion of the second color film layer.

For example, the first color film layers of the plurality of repeating units are formed in a same patterning process, the second color film layers of the plurality of repeating units are formed in a same patterning process, and the third color film layers of the plurality of repeating units are formed in a same patterning process.

It is to be noted that "the second color film layer partially covering the first color film layer" represents that, when the color film layer is used in a display device, in each pixel unit, only a part of the second color film layer covers the first color film layer, and the part of the second color film layer continuously covers the surface of one side of the first color film layer, not the second color film layer completely covers the first color film layer, nor the second color film layer intermittently covers the first color film layer.

For example, adhesion, also known as cohesiveness or adhesiveness, refers to the combining force of two or more objects in contact with each other. The adhesion of the first color film layer is greater than the adhesion of the second color film layer, which represents that the combining force of the first color film layer and the bearing layer (for example, the cathode of the light-emitting element described later) in contact with each other is greater than the combining force of the second color film layer and the bearing layer (for example, the cathode of the light-emitting element described later) in contact with each other, that is, the first color film layer is less likely to peel off from the bearing layer than the second color film layer.

For example, the air permeability of the second color film layer is greater than the air permeability of the first color film layer. Because the adhesion of the second color film layer is less than that of the first color film layer, in the process of forming the second color film layer, the material of the second color film layer has better fluidity, and the resulting second color film layer has better air permeability.

It is to be noted that the air permeability refers to the permeability of air to the first color film layer or the second color film layer. For example, both the first color film layer and the second color film layer are microporous air-permeable films. For example, the air permeable amount of the first color film per square meter per minute is 10 ml to 300 ml; the air permeable amount of the second color film per square meter per minute is 500 ml to 1000 ml.

Figure 3A:
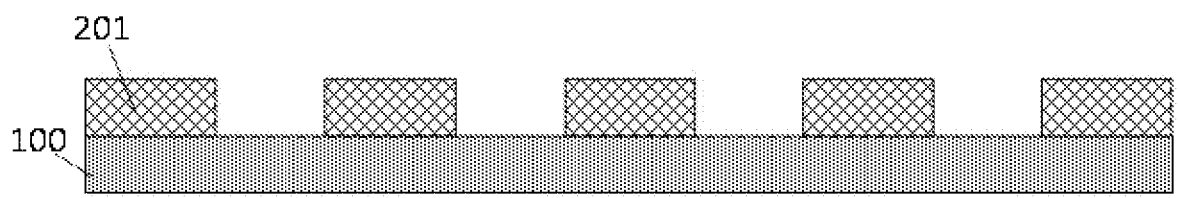
FIG. 3A-3B are process diagrams of a preparation method of each repeating unit of a color film layer provided by an embodiment of the present disclosure.
Figure 3B:
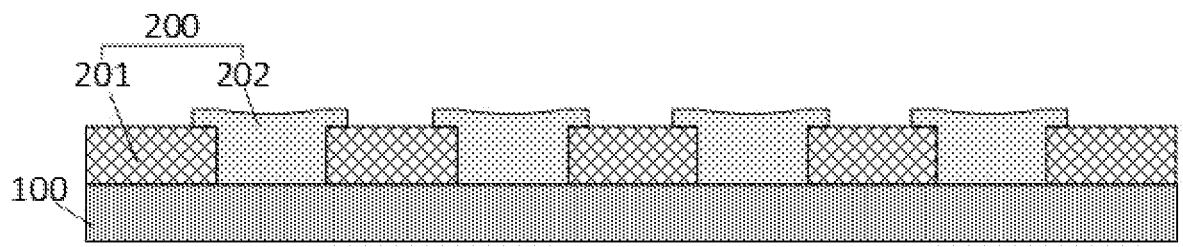

For example, FIGS. 3A-3B are process diagrams of a preparation method of each repeating unit of a color film layer according to an embodiment of the present disclosure.

As shown in FIG. 3A, first color film layers 201 spaced apart from each other are formed on a bearing layer 100. In FIG. 3A, the spacing between any two adjacent first color film layers 201 is equal. According to different requirements, the distance between two adjacent first color film layers 201 may also be unequal, which is not limited herein.

For example, as shown in FIG. 3B, a second color film layer 202 is formed between any two adjacent first color film layers 201, and the second color film layer 202 covers the two first color film layers 201 adjacent thereto at the border edges between the first color film layers 201 and the second color film layer 202. For example, the first color film layer 201 and the second color film layer 202 form a color film layer 200.

For example, in the process of forming the color film layer 200, the first color film layer 201 with high adhesion is formed earlier, the second color film layer 202 with low adhesion is formed later, and the second color film layer 202 with low adhesion partially covers the first color film layer 201 with high adhesion, so that the contact area between the second color film layer 202 with low adhesion and the bearing layer 100 can be decreased. The base material of the first color film layer 201 and the base material of the second color film layer 202 are substantially the same, so that the adhesion between the first color film layer 201 and the second color film layer 202 is greater than the adhesion between the second color film layer 202 and the bearing layer 100. For example, the base materials of both the first color film layer 201 and the second color film layer 202 may include propylene glycol monomethyl ether ester, 3-methoxybutyl acetate, and acrylic resin. Compared with the case where the second color film layer 202 does not cover the first color film layer 201 at all, the second color film layer 202 partially covering the first color film layer 201 can reduce the possibility of the entirety of the first color film layer 201 and the second color film layer 202 peeling off from the bearing layer 100.

In addition, because the second color film layer 202 has low adhesion, it has good fluidity, in the process of forming the second color film layer 202, the content of air bubbles on the surface of the entirety of the first color film layer 201 and the second color film layer 202 away from the bearing layer 100 can be reduced, and the uniformity of the film thickness of the entirety of the first color film layer 201 and the second color film layer 202 at the position where the two layers overlap is improved. As shown in FIG. 3B, at the position where the second color film layer 202 covers the first color film layer 201, the surface of the second color film layer 202 is flat.

At present, no black matrix (BM) is arranged when preparing color film layers on silicon-based OLED microdisplays. This is because in the process of forming the metal black matrix (formed by low-reflectivity chromium) by the sputtering process, it will adversely affect the thin-film packaging layer in the silicon-based OLED microdisplay, and thus adversely affect the light-emitting element; while the black matrix formed of resin material cannot achieve high accuracy. However, the absence of the black matrix reduces the contrast of the silicon-based OLED microdisplay and affects the display effect. When the color film layer is integrated on a silicon-based OLED micro-display, although the integration of the silicon-based OLED microdisplay is improved, the yield of the final product will be affected from the perspective of industrialization. Once problems occur in the process of preparing the color film layer, the silicon-based OLED microdisplays will be scrapped, thereby production costs is increased.

For example, when the color film layer shown in FIG. 3B is used in a display device, in one pixel unit, one edge of the second color film layer 202 overlaps with an edge of an adjacent first color film 201, so the position where the second color film layer 202 and the first color film layer 201 overlap can block the transmission of light, and thus they can play a role similar to a black matrix, and solve the problem caused by the lack of the black matrix and avoiding the risk of scrapping the silicon-based OLED microdisplay due to the preparation of the black matrix.

For example, as shown in FIG. 3B, in two adjacent pixel units, two edges of the second color film layer 202 respectively overlap the edges of the two first color film layers 201 adjacent to the second color film 202, that is, one edge of the second color film layer 202 covers the first color film layer 201 included in the pixel unit where it is located, so that the edges of the two sub-pixel units in one pixel unit can overlap, which can block the transmission of light, which plays a role similar to a black matrix. The other edge of the second color film layer 202 covers the first color film layer 201 included in a pixel unit adjacent to the pixel unit where the second color film layer is located, so that the edges of the two adjacent pixel units can overlap, which can block the transmission of light, which plays a role similar to a black matrix.

Figure 4:
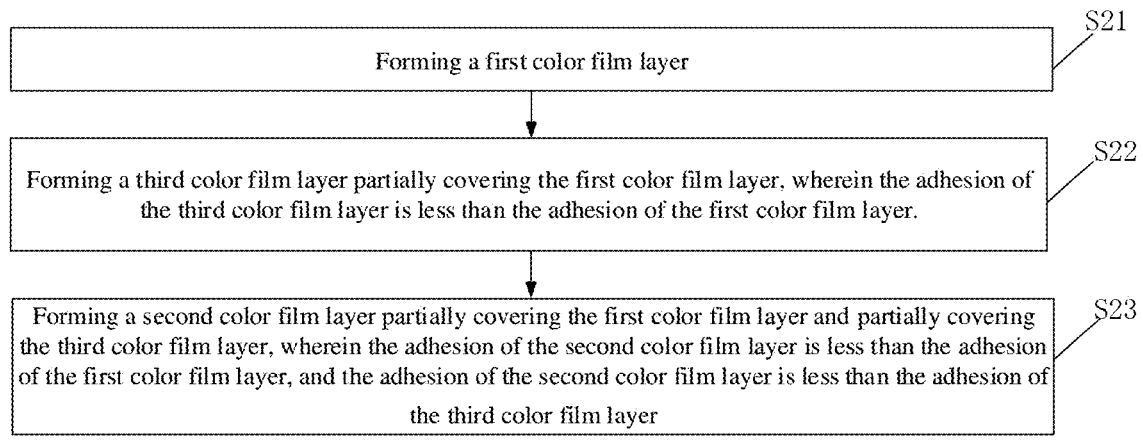
FIG. 4 is a flowchart of a preparation method of each repeating unit of another color film layer provided by an embodiment of the present disclosure.

For example, FIG. 4 is a flowchart of another preparation method of each repeating unit of a color film layer according to an embodiment of the present disclosure. As shown in FIG. 4, the preparation method of the color film layer includes the following steps:

Step S21: forming a first color film layer.

Step S22: forming a third color film layer partially covering the first color film layer, in which the adhesion of the third color film layer is less than the adhesion of the first color film layer.

Step S23: forming a second color film layer partially covering the first color film layer and partially covering the third color film layer, in which the adhesion of the second color film layer is less than the adhesion of the first color film layer, and the adhesion of the second color film layer is less than the adhesion of the third color film layer.

It is to be noted that the adhesion of the second color film layer is less than that of the third color film layer, which is also relative to the same bearing layer, that is, the second color film layer and the third color film layer are located on the same bearing layer, and the adhesion between the second color film layer and the bearing layer is less than the adhesion between the third color film layer and the bearing layer.

For example, different from the preparation method shown in FIG. 2, the preparation method shown in FIG. 4 further includes forming the third color film layer after forming the first color film layer and before forming the second color film layer. The third color film layer partially covers the first color film layer, and the second color film layer partially covers the third color film layer; and the adhesion of the third color film layer is greater than the adhesion of the second color film layer and less than the adhesion of the first color film layer.

It is to be noted that "the third color film layer partially covering the first color film layer" refers to that, when the color film layer is used in a display device, in each pixel unit, only a part of the third color film layer covers the first color film layer, and the part of the third color film layer continuously covers the surface of one side of the first color film layer, not the third color film layer completely covers the first color film layer, nor the third color film layer intermittently covers the first color film layer.

It is also be noted that "the second color film layer partially covering the first color film layer and partially covering the third color film layer" refers to that, when the color film layer is used in a display device, in each pixel unit, only a part of the second color film layer covers the first color film layer, not the second color film layer completely covers the first color film layer, and the part of the second color film layer continuously covers the surface of one side of the first color film layer, not the second color film layer intermittently covers the first color film layer; only another part of the second color film layer covers the third color film layer, and the another part of the second color film layer continuously covers the surface of one side the third color film layer near the first color film layer, not the second color film layer completely covers the third color film layer, nor the second color film layer intermittently covers the third color film layer.

For example, when the color film layer is used in a display device, in one pixel unit, the first color film layer and the third color film layer are spaced apart from each other, the second color film layer is formed in a region spaced apart between the first color film layer and the third color film layer, one edge of the second color film layer overlaps with an edge of the first color film layer adjacent the second color film layer, and the other edge of the second color film layer overlaps with an edge of the third color film layer adjacent to the second color film layer.

Figure 5A:
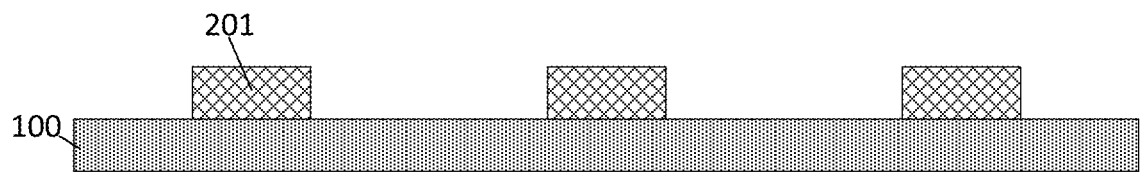
FIG. 5A-5C are process diagrams of a preparation method of each repeating unit of another color film layer provided by an embodiment of the present disclosure.
Figure 5B:
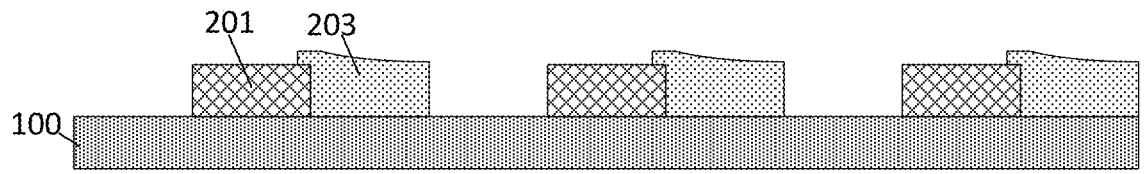
Figure 5C:
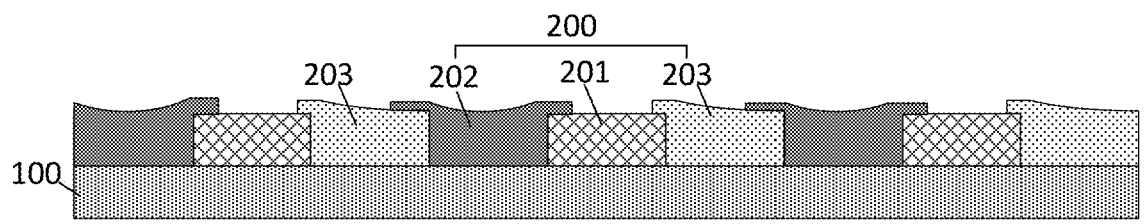

For example, FIGS. 5A-5C are process diagrams of a preparation method of each repeating unit of another color film layer according to an embodiment of the present disclosure.

As shown in FIG. 5A, first color film layers 201 spaced apart from each other are formed on the bearing layer 100. In FIG. 5A, the spacing between any two adjacent first color film layers 201 is equal. According to different designs, the spacing between two adjacent first color film layers 201 may also be unequal, which is not limited herein.

As shown in FIG. 5B, a third color film layer 203 is formed between any two adjacent first color film layers 201, and a certain gap still remains between any two adjacent first color film layers 201 for subsequent formation of the second color film layer. The third color film layer 203 covers the first color film layer 201 adjacent thereto at the edge bordering the first color film layer 201. The third color film layer 203 partially covering the first color film layer 201 can reduce the risk of the entirety of the third color film layer 203 and the first color film layer 201 peeling off from the bearing layer 100. The reason can be referred to the related description in the above, which will not be repeated here.

For example, as shown in FIG. 5C, when the color film layer 200 is provided in a display device, the second color film layer 202 is formed between the first color film layer 201 included in one pixel unit and the third color film layer 203 included in the pixel unit adjacent to the one pixel unit. The second color film layer 202 covers the first color film layer 201 adjacent to the second color film layer 202 at the edge bordering the first color film layer 201, and the second color film layer 202 covers the third color film layer 203 adjacent to the second color film layer 202 at the edge bordering the third color film layer 203.

For example, the adhesion of the second color film layer 202 is less than the adhesion of the first color film layer 201, and the adhesion of the second color film layer 202 is less than the adhesion of the third color film layer 203. The second color film layer 202 with the lowest adhesion partially covers the first color film layer 201 with the greatest adhesion and the third color film layer 203 with the adhesion between the first color film layer 201 and the second color film layer 202 on both sides, respectively, so that the contact area between the second color film layer 202 and the bearing layer 100 can be reduced compared to the case where the second color film layer 202 completely covers the bearing layer 100. The base material of the first color film layer 201, the base material of the second color film layer 202 and the base material of the third color film layer 203 are substantially the same, so that the adhesion between the second color film layer 202 and the first color film layer 201 is greater than the adhesion between the second color film layer 202 and the bearing layer 100, and the adhesion between the second color film layer 202 and the third color film layer 203 is greater than the adhesion between the second color film layer 202 and the bearing layer 100. For example, the base materials of the first color film layer 201, the second color film layer 202, and the third color film layer 203 include propylene glycol monomethyl ether ester, 3-methoxybutyl acetate, and acrylic resin. Compared with the case where the second color film layer 202 does not cover the first color film layer 201 and the third color film layer 203 at all, the second color film layer 202 partially covering the first color film layer 201 and partially covering the third color film layer 203 can reduce the possibility of the entirety of the first color film layer 201, the second color film layer 202, and the third color film layer 203 peeling off from the bearing layer 100.

For example, because the second color film layer 202 has low adhesion, it has the best fluidity. In the process of forming the second color film layer 202, the content of air bubbles on the surface of the entirety of the first color film layer 201, the second color film layer 202, and the third color film layer 203 away from the bearing layer 100 can be reduced, which can improve the uniformity of the film thickness of the entirety of the first color film layer 201, the second color film layer 202, and the third color film layer 203 at the position where any two of them overlap. As shown in FIG. 5C, at the position where the second color film layer 202 overlaps with the first color film layer 201, the surface of the second color film layer 202 is flat. At a position where the second color film layer 202 overlaps with the third color film layer 203, the surface of the second color film layer 202 is also flat.

For example, when the color film layer shown in FIG. 5C is used in a display device, in one pixel unit, one edge of the second color film layer 202 overlaps with the edge of the first color film layer 201 adjacent to the second color film layer, and the other edge of the second color film layer 202 overlaps with the edge of the third color film layer 203 adjacent to the second color film layer 202, so both the position where the second color film layer 202 and the first color film layer 201 overlap and the position where the second color film layer 202 and the third color film layer 203 overlap can block the transmission of light, and thus they can play a role similar to a black matrix, which solves the problem caused by the lack of the black matrix and eliminating the risk of scrapping the silicon-based OLED microdisplay due to the preparation of the black matrix.

For example, the air permeability of the third color film layer 203 is greater than the air permeability of the first color film layer 201 and less than the air permeability of the second color film layer 202. Because the adhesion of the second color film layer 202 is less than the adhesion of the first color film layer 201 and the third color film layer 203, in the process of forming the second color film layer 202, the material of the second color film layer 202 has the best fluidity, and the second-color film layer 202 finally formed also has the best air permeability.

For example, the first color film layer 201, the second color film layer 202, and the third color film layer 203 are all microporous air-permeable films. For example, the air permeable amount of the first color film layer 201 per minute per square meter is 10 ml~300 ml; the air permeable amount of the third color film layer 202 per minute per square meter is 300 ml~500 ml; and the air permeable amount of the second color film layer per square meter per minute is 500 ml to 1000 ml.

For example, in the structure shown in FIG. 5C, the first color film layer 201 is a green film layer, the second color film layer 202 is a blue film layer, and the third color film layer 203 is a red film layer.

For example, the material of the first color film layer 201 includes a base material and a first color material; the material of the second color film layer 202 includes a base material and a second color material; and the material of the third color film 203 includes a base material and a third color material.

For example, the base material includes propylene glycol monomethyl ether ester, 3-methoxybutyl acetate and acrylic resin; the first color material includes $C_{32}Cl_{16}CuN_8$, $C_{16}H_{11}N_5O_4$ and auxiliary green pigment; the second color material includes 2-butanone, phthalocyanine blue and auxiliary blue pigment; and the third color material includes 2-butanone, $C_{28}H_{16}N_2O_4$, $C_{16}H_9N_5O_6$ and auxiliary red pigment.

For example, by mass percentage, the material of the first color film layer 201 includes 50 wt %~60 wt % propylene glycol monomethyl ether ester, 20 wt %~25 wt % 3-methoxybutyl acetate, 1 wt %~10 wt % acrylic resin, 5 wt %~11 wt % $C_{32}Cl_{16}CuN_8$, 3 wt %~10 wt % $C_{16}H_{11}N_5O_4$, and 1 wt %~10 wt % auxiliary green pigment.

For example, by mass percentage, the material of the second color film layer 202 includes 60 wt %~75 wt % propylene glycol monomethyl ether ester, 9 wt %~14 wt % 3-methoxybutyl acetate, 5 wt %~10 wt % acrylic resin, 0.05 wt %~0.5 wt % 2-butanone, 3 wt %~10 wt % phthalocyanine blue, and 1 wt %~10 wt % auxiliary blue pigment.

For example, by mass percentage, the material of the third color film layer 203 includes 60 wt %~70 wt % propylene glycol monomethyl ether ester, 10 wt %~30 wt % 3-methoxybutyl acetate, 2 wt %~10 wt % acrylic resin, 0.05 wt %~0.5 wt % 2-butanone, 2 wt %~10 wt % $C_{28}H_{16}N_2O_4$, 0.5 wt %~3 wt % $C_{16}H_9N_5O_6$, and 1 wt %~10 wt % auxiliary red pigment.

For example, the viscosity of the material of the first color film layer 201 is 8.1 mPa·s~9.0 mPa·s, the viscosity of the material of the second color film layer 202 is 7.5 mPa·s~8.0 mPa·s, and the viscosity of the material of the third color film is 4 mPa·s~4.6 mPa·s.

For example, in one example, by mass percentage, the material of the first color film layer 201 includes 55 wt % propylene glycol monomethyl ether ester, 23 wt % 3-methoxybutyl acetate, 5 wt % acrylic resin, 5 wt % $C_{32}Cl_{16}CuN_8$, 7 wt % $C_{16}H_{11}N_5O_4$, and 5 wt % auxiliary green pigment. For example, the viscosity of the material of the first color film layer 201 is 8.4 mPa·s.

For example, in one example, by mass percentage, the material of the second color film layer 202 includes 68 wt % propylene glycol monomethyl ether ester, 12 wt % 3-methoxybutyl acetate, 6 wt % acrylic resin, 0.3 wt % 2-butanone, 6 wt % phthalocyanine blue, and 7.7 wt % auxiliary blue pigment. For example, the viscosity of the material of the second color film layer 202 is 7.8 mPa·s.

For example, in one example, by mass percentage, the material of the third color film layer 203 includes 65 wt % propylene glycol monomethyl ether ester, 15 wt % 3-methoxybutyl acetate, 6 wt % acrylic resin, 0.3 wt % 2-butanone, 8 wt % $C_{28}H_{16}N_2O_4$, 1.7 wt % $C_{16}H_9N_5O_6$, and 4 wt % auxiliary red pigment. For example, the viscosity of the material of the third color film layer 203 is 4.4 mPa·s.

For example, the areas of the first color film layer 201, the second color film layer 202, and the third color film layer 203 provided on one bearing layer are all less than 20 $\mu m^2$, for example, they are 10 $\mu m^2$-20 $\mu m^2$.

For example, the areas of the first color film layer 201, the second color film layer 202, and the third color film layer 203 are equal or unequal. The areas of the first color film layer 201, the second color film layer 202, and the third color film layer 203 may all be 10 $\mu m^2$, 15 $\mu m^2$, or 20 $\mu m^2$.

For example, the temperatures used when preparing the first color film layer 201, the second color film layer 202, and the third color film layer 203 are all less than 90° C., for example, the temperatures are 10° C., 20° C., 25° C., 30° C., 35° C., 40° C., 45° C., 60° C., 65° C., 70° C., 85° C., or 90° C., etc.

For example, the preparation processes of the first color film layer 201, the second color film layer 202, and the third color film layer 203 include: forming a first color film, a second color film, and a third color film by using a spin coating process, and then forming the first color film layer 201, the second color film layer 202, and the third color film layer 203 by performing a patterning process on the first color film, the second color film, and the third color film, respectively.

Figure 6A:
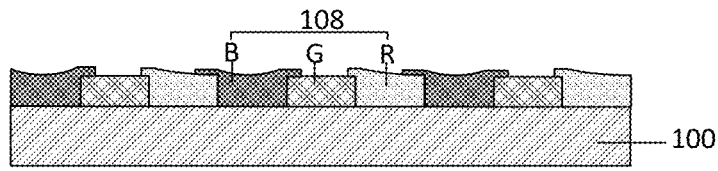
FIG. 6A is a schematic diagram of a cross-sectional structure of a display substrate provided by an embodiment of the present disclosure.
Figure 6B:
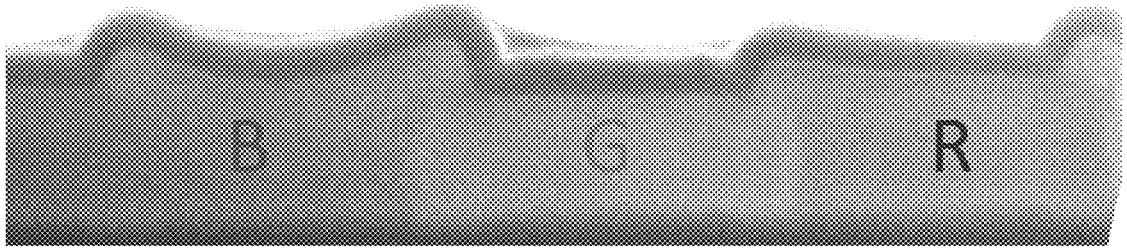
FIG. 6B is an electron micrograph of a cross-sectional structure of a color filter layer included in a display substrate provided by an embodiment of the present disclosure.

For example, at least one embodiment of the present disclosure also provides a display substrate. FIG. 6A is a schematic diagram of a cross-sectional structure of a display substrate according to an embodiment of the present disclosure. As shown in FIG. 6A, the display substrate includes a bearing layer 100 and a plurality of repeating units 108, each repeating unit 108 includes a green film layer G, a red film layer R, and a blue film layer B, the green film layer G, the red film layer R, and the blue film layer B are disposed on the bearing layer 100 and are in direct contact with the first surface of the bearing layer 100. FIG. 6B is an electron micrograph of a cross-sectional structure of a color filter layer included in a display substrate according to an embodiment of the present disclosure. As shown in FIGS. 6A and 6B, the color film layer includes the green film layer G, the red film layer R, and the blue film layer B, the green film layer G, the red film layer R, and the blue film layer B are disposed on the bearing layer 100 and are in direct contact with the first surface of the bearing layer 100. On a plane parallel to the first surface of the bearing layer 100, in each repeating unit 108, the red film layer R is disposed on a first side of the green film layer G, and the blue film layer B is disposed on a second side of the green film layer G opposite to the first side, that is, the green film layer G is disposed between the red film layer R and the blue film layer B; at least one of the red film layer R and the blue film layer B covers a part of the green film layer G; at least one part of green film layer G does not overlap with red film layer R and blue film layer B, so that the green film layer G, the red film layer R, and the blue film layer B respectively allow a part of the green light, red light, and blue light to pass through, so as to be mixed into white light later.

For example, as shown in FIGS. 6A and 6B, the adhesion of the green film layer G is greater than the adhesion of the red film layer R and the adhesion of the blue film layer B. In this way, the green film layer G is formed at the lowest layer, and the red film layer R and the blue film layer B respectively cover a part of the green film layer G, which can enhance the adhesion between the red film layer R and the blue film layer B and the bearing layer 100.

It is to be noted that the adhesion of the green film layer G is greater than the adhesion of the red film layer R and the adhesion of the blue film layer B, which is relative to the same bearing layer 100, that is, the green film layer G, the red film layer R, and the blue film layer B are located on the same bearing layer 100, and the adhesion between the green film layer G and the bearing layer 100 is greater than the adhesion between the red film layer R and the bearing layer 100, and is greater than the adhesion between the blue film layer B and the bearing layer 100.

For example, a green film layer G with the highest adhesion is formed earlier, a red film layer R with the next highest adhesion is formed later, and a blue film layer B with the lowest adhesion is formed last. The red film layer R partially covers the green film layer G, which can reduce the contact area between the red film layer R and the bearing layer with low adhesion. The blue film layer B partially covers the green film layer G, which can reduce the contact area between the blue film layer B and the bearing layer with low adhesion. The properties of the green film layer G, the red film layer R, and the blue film layer B are similar, both the adhesion between the green film layer G and the red film layer R and the adhesion between the green film layer G and the blue film layer B are greater than the adhesion between the red film layer R or the blue film layer B and the bearing layer 100, in this way, compared with the case where the red film layer R or the blue film layer B does not cover the green film layer G at all, the red film layer R or the blue film layer B partially covering the green film layer G can reduce the possibility of the entirety of the red film layer R and the green film layer G or the entirety of the blue film layer B and the green film layer G peeling off from the bearing layer 100.

In addition, because the red film layer R and the blue film layer B have low adhesion, they have good fluidity, in the process of forming the green film layer G or the red film layer R, the content of air bubbles on the surface of the entirety of the green film layer G or the red film layer R or the entirety of the green film layer G and the blue film layer B away from the bearing layer 100 can be reduced, so that the uniformity of the film thickness of the entirety of the green film layer G and the red film layer R or the entirety of the green film layer G and the blue film layer B at the position where the two overlap is improved.

For example, each repeating unit (only one repeating unit is shown in FIG. 6B) includes the green film layer G, the red film layer R, and the blue film layer B. In each repeating unit, the green film layer G is located between the red film layer R and the blue film layer B, the green film layer G and the red film layer R do not overlap at least partially, the green film layer G and the blue film layer B do not overlap at least partially, the red film layer R and the blue film layer B do not overlap at all, and the blue film layer B of at least one repeating unit partially covers the red film layer R of an adjacent repeating unit. In this way, blue light, green light, and red light can be emitted from the same repeating unit, and it can be ensured that the blue film layer B in one repeating unit and the red film layer R in another repeating unit have an overlapping region at the border of the two repeating units, and no light passes through the overlapping region, which also plays a role similar to a black matrix.

For example, as shown in FIGS. 6A and 6B, in each repeating unit, the red film layer R and a part of the green film layer G overlap to form a first overlap region; the blue film layer B and a part of the green film layer G overlap to form a second overlap region; no light passes through the first overlap region and the second overlap region, and the first overlap region and the second overlap region can play a role similar to a black matrix, and can distinguish two sub-units in an image repeating unit at the same time.

For example, the first overlap region and the second overlap region respectively account for 5%-20% of the total area of the green film layer G, that is, 10% to 40% of the surface area of the green film layer G is covered by other color film layers with poor adhesion, and 60% to 90% of the surface area of the green film layer G is exposed to allow the green light to pass through.

For example, the first overlap region and the second overlap region respectively account for 10% of the total area of the green film layer G. In this way, 80% of the surface area of the green film layer G is exposed to allow the green light to pass through.

For example, the first overlap region and the second overlap region do not overlap.

For example, as shown in FIGS. 6A and 6B, the cross-sectional shape of the green film layer G perpendicular to the bearing layer 100 is a rectangle with rounded corners; the portion of the red film layer R overlapping with a part of the green film layer G is protruded toward the side away from the green film layer G; the portion of the blue film layer B overlapping with a part of the green film layer G is protruded to the side away from the bearing layer, and the portion of the blue film layer B overlapping with the red film layer of an adjacent repeating unit is protruded toward the side away from the bearing layer.

For example, as shown in FIGS. 6A and 6B, the edges of both sides of the blue film layer B are convex, and the middle of the blue film layer B is concave; relative to the bearing layer 100, the height of the red film layer R gradually decreases from the overlap with the green film layer G to the direction away from the green film layer G. The height here refers to that, relative to the surface of the bearing layer 100 for forming the green film layer, the red film layer, and the blue film layer, at the portion where the red film layer overlaps the green film layer, although the thickness of the red film layer is relatively small, compared to the middle region of the red film layer, the overall height of the portion where the red film layer overlaps the green film layer is higher than other regions of the red film layer due to the presence of the green film layer underneath. If the green film layer, the red film layer and the blue film layer are formed by the spin coating process, due to the fluidity of the liquid, the surface of the red film layer forms a relatively gentle slope, which slopes from the first overlap region formed by the portion overlapping of the red film layer and the green film layer to the edge on the opposite side, that is, the surface of the red film layer away from the bearing layer 100 forms a sloping surface that gradually descends in the direction from the blue film layer to the red film layer. For the blue film layer, because at least two opposite sides overlap with other color film layers, the surface of the blue film layer may be a surface descending from the two overlapping sides to the middle region, respectively. For example, the thickness of the overlapping region of the blue film layer and the red film layer is approximately the same as the thickness of the second overlapping area formed by the overlap of the blue film layer and the green film layer, the two sides of the blue film layer overlapping with the other film layers are substantially symmetrical, and the lowest point of the height of the blue film layer relative to the surface of the bearing layer is approximately in the central region of the blue film layer.

For example, as shown in FIGS. 6A and 6B, at the first overlap region formed by the overlap of the red film layer R and a part of the green film layer G, the total thickness of the stack of the red film layer R and the green film layer G is greater than the thickness of the middle region of the red film layer R and the thickness of the middle region of the green film layer G, respectively, and at the first overlap region formed by the overlap of the red film layer R and a part of the green film layer G, the thickness of the red film layer R is less than the thickness of the middle region of the red film layer R.

For example, as shown in FIGS. 6A and 6B, at the second overlap region formed by the overlap of the blue film layer B and a part of the green film layer G, the total thickness of the stack of the blue film layer B and the green film layer G is greater than the thickness of the middle region of the blue film layer B and the thickness of the middle region of the green film layer G, respectively, and at the second overlap region formed by the overlap of the blue film layer B and a part of the green film layer G, the thickness of the blue film layer B is less than the thickness of the middle region of the blue film layer B.

For example, the surface of the blue film layer B away from the bearing layer 100 is recessed toward the bearing layer, the orthographic projection of the blue film layer B on the carrier layer 100 is a rectangle with rounded corners, and the thickness of the edge region of the blue film layer is less than the thickness of the middle region of the blue film layer. For example, on a plane parallel to the first surface of the bearing layer 100, the direction from the blue film layer to the red film layer in a repeating unit is the first direction, and the second direction is the direction perpendicular to the first direction. In the first direction, the two sides of the blue film layer are directly adjacent to the red film layer and the green film layer, respectively, and in the second direction, the two sides of the blue film layer are also directly adjacent to the red film layer and the green film layer, respectively, so that the edge regions on the four sides of the blue film layer overlap with other color film layers.

For example, the surface of the green film layer G away from the bearing layer 100 is protruded in a direction away from the carrier layer, the orthographic projection of the green film layer G on the carrier layer 100 is a rectangle with rounded corners, and the thickness of the edge region of the green film layer G is less than the thickness of the middle region of the green film layer G.

For example, the orthographic projection of the red film layer R on the bearing layer 100 is a rectangle with rounded corners, the thickness of the edge regions of the red film layer R is less than the thickness of the middle region of the red film layer R, and in each repeating unit, the thickness of the red film layer R increases first and then decreases in the direction from the blue film layer B to the red film layer R.

For example, the display substrate may be an organic light-emitting diode display substrate, and the bearing layer may be a package layer for packaging the organic light-emitting diode, or it may be a base substrate. The display substrate may also be other types of display substrates, and the bearing layer may also be other film layers, such as a protective layer, a touch layer, an optical layer, etc.

Figure 7:
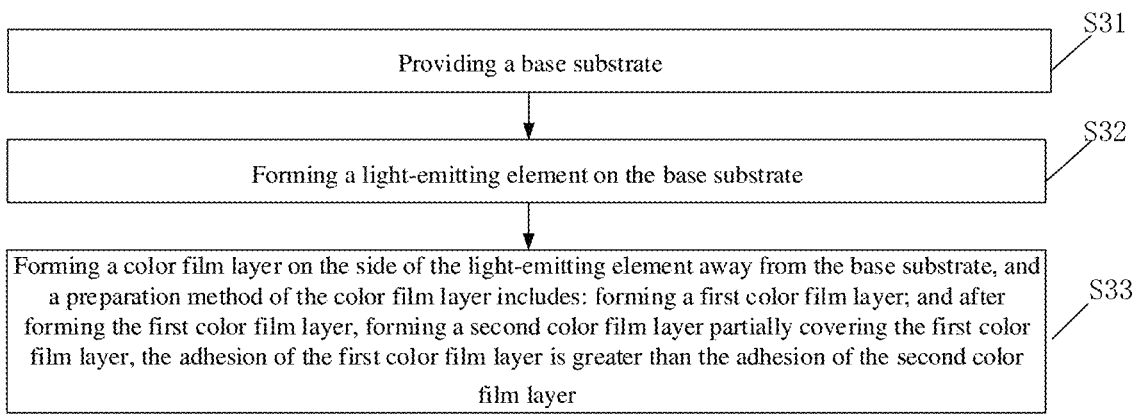
FIG. 7 is a flowchart of a preparation method of a display substrate provided by an embodiment of the present disclosure.

For example, at least one embodiment of the present disclosure also provides a preparation method of a display substrate. FIG. 7 is a flowchart of a preparation method of a display substrate according to an embodiment of the present disclosure. As shown in FIG. 7, the preparation method includes the following steps:

Step S31: providing a base substrate;

Step S32: forming a light-emitting element on the base substrate;

Step S33: forming a color film layer on the side of the light-emitting element away from the base substrate, and a preparation method of the color film layer includes: forming a first color film layer; and after forming the first color film layer, forming a second color film layer partially covering the first color film layer, the adhesion of the first color film layer is greater than the adhesion of the second color film layer.

For example, for the properties of the color film layer including the first color film layer and the second color film layer, reference may be made to the related description in the above description, and details are not described herein again.

For example, the preparation method of the display substrate further includes forming a passivation layer and a package layer on the side of the light-emitting element away from the base substrate, so as to reduce or avoid the adverse effect of water, oxygen, etc. on the performance of the light-emitting element.

For example, the preparation method of the display substrate further includes sequentially forming a filling material and a cover plate on the side of the color film layer away from the base substrate.

For example, FIGS. 8A-8E are process diagrams of a preparation method of a display substrate 300 according to an embodiment of the present disclosure. The description will be made by using the case where the color film layer includes the first color film layer, the second color film layer, and the third color film layer as an example.

Figure 8A:
FIG. 8A-8E are process diagrams of a preparation method of a display substrate provided by an embodiment of the present disclosure.

As shown in FIG. 8A, a base substrate 301 is provided, and the material of the base substrate 301 is a silicon-based material.

Figure 8B:
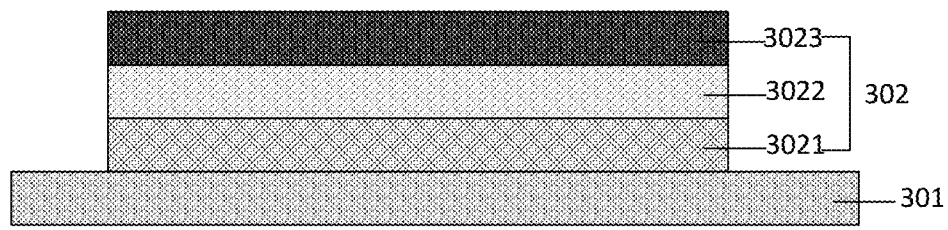

As shown in FIG. 8B, the light-emitting element 302 is formed on the base substrate 301.

For example, the light-emitting element 302 includes an anode 3021, a light-emitting function layer 3022, a cathode 3023, and the like, which are sequentially stacked on a base substrate 301.

For example, the material of the anode 3021 may be a transparent conductive material, and the transparent conductive material includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, and the like.

For example, the material of the cathode 3023 may include silver, magnesium, aluminum, lithium single metal or magnesium aluminum alloy (MgAl), lithium aluminum alloy (LiAl), and the like.

For example, the light-emitting functional layer 3022 may include a hole transport layer, a light-emitting layer, and an electron transport layer. In order to improve the efficiency of injecting electrons and holes into the light-emitting layer, the light-emitting functional layer may further include an organic functional layer, such as an electron injection layer disposed between the cathode and the electron transport layer, and a hole injection layer disposed between the anode and the hole transport layer.

Figure 8C:
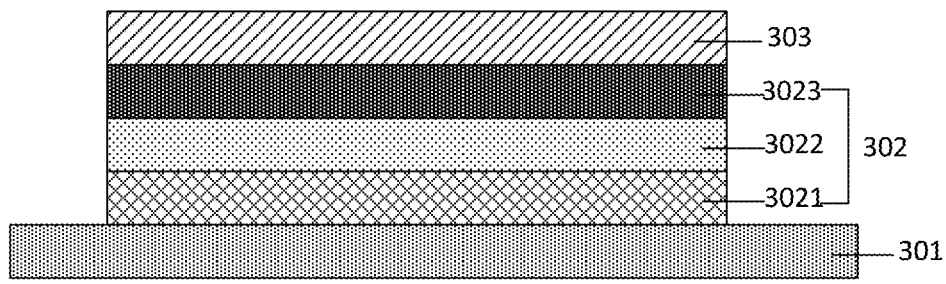

As shown in FIG. 8C, a passivation layer 303 is formed on the side of the light-emitting element 302 away from the base substrate 301, in order to reduce or avoid the adverse effects of water, oxygen, etc. on the performance of the cathode 3023 and the light-emitting functional layer 3022.

For example, the material of the passivation layer 303 includes silicon nitride, silicon oxide, or the like.

For example, in order to prevent water, oxygen, etc. from adversely affecting the performance of the cathode 3023 and the light-emitting function layer 3022, a package layer may be formed on the side of the passivation layer 303 away from the cathode 3023. For example, the material of the package layer may be silicon nitride (SiNx), silicon oxide (SiOx), acrylic resin, or the like.

Figure 8D:
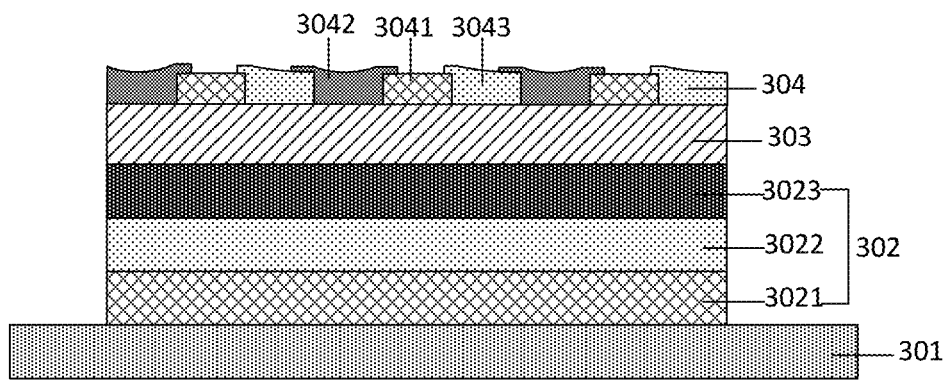

As shown in FIG. 8D, a color film layer 304 is formed on the side of the passivation layer 303 away from the base substrate 301. It is to be noted that when the package layer disposed on the side of the passivation layer away from the cathode is further included, the color film layer 304 is disposed on the side of the package layer away from the base substrate 301.

For example, in each pixel unit, the color film layer 304 includes a first color film layer 3041, a second color film layer 3042 partially covering the surface on one side of the first color film layer 3041, and a third color film layer 3043 partially covering the surface on the other side of the first color film layer 3041. In two adjacent pixel units, the second color film layer 3042 in one pixel unit partially covers the third color film layer 3043 in the pixel unit adjacent to the one pixel unit. The adhesion of the third color film layer 3043 is greater than the adhesion of the second color film layer 3042 and less than the adhesion of the first color film layer 3041.

For example, in the process of preparing the color film layer 304, for the materials of the first color film layer 3041, the second color film layer 3042, and the third color film layer 3043, etc., reference may be made to the related descriptions in the foregoing related embodiments, and details are not described herein again.

Figure 8E:
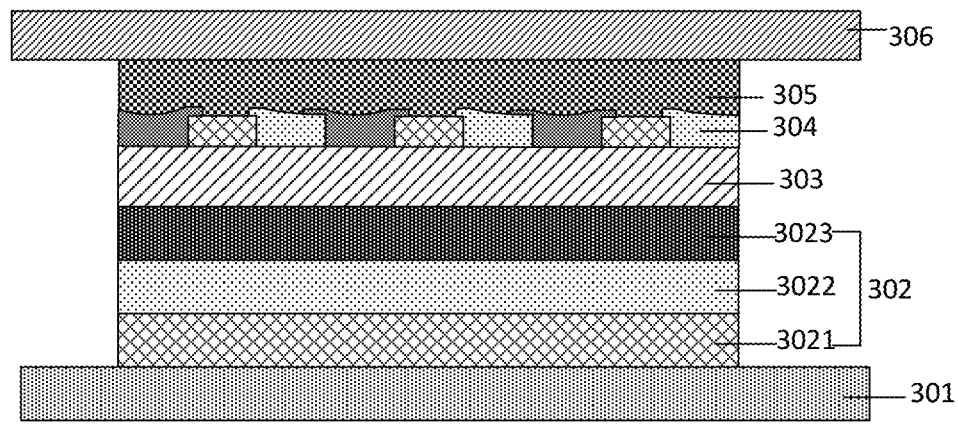

As shown in FIG. 8E, a filling material 305 and a cover plate 306 are sequentially formed on the side of the color film layer 304 away from the base substrate 301.

For example, the filling material 305 is AB glue, which is a two-liquid mixed hardening glue whose main components are acrylic, epoxy and polyurethane. For example, the filler material 305 mainly plays a role of bonding the color film layer 304 and the cover plate 306, and a role of flattening.

For example, the cover plate 306 is a glass cover plate, and the material of the cover plate 306 may also be other materials, as long as the cover plate 306 can play a protective role and has transparent properties.

Figure 9A:
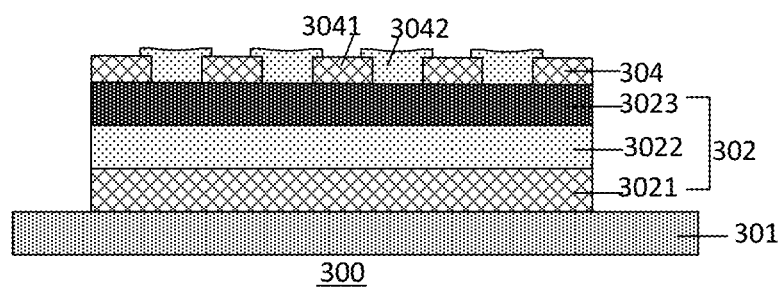
FIG. 9A is a schematic diagram of a cross-sectional structure of a display substrate provided by an embodiment of the present disclosure.

At least one embodiment of the present disclosure also provides a display substrate. FIG. 9A is a schematic diagram of a cross-sectional structure of a display substrate according to an embodiment of the present disclosure. A display substrate 300 shown in FIG. 9A is described by using the color film layer 304 including the first color film layer 3041 and the second color film layer 3042 as an example.

For example, as shown in FIG. 9A, the display substrate 300 includes a base substrate 301; and a light-emitting element 302 and a color film layer 304 sequentially stacked on the base substrate 301. The color film layer 304 includes a first color film layer 3041 and a second color film layer 3042, the second color film layer 3042 partially covers the first color film layer 3041, and the adhesion of the first color film layer 3041 is greater than the adhesion of the second color film layer 3042.

For example, the light-emitting element 302 includes an anode 3021, a light-emitting function layer 3022, and a cathode 3023 that are sequentially stacked on the base substrate 301. The light-emitting functional layer 3022 may include a hole transport layer, a light-emitting layer, and an electron transport layer. In order to improve the efficiency of injecting electrons and holes into the light-emitting layer, the light-emitting functional layer may further include an organic functional layer, such as an electron injection layer disposed between the cathode and the electron transport layer, and a hole injection layer disposed between the anode and the hole transport layer.

For example, the second color film layer 3042 with low adhesion partially covers the first color film layer 3041 with high adhesion, which can reduce the contact area between the second color film layer 3042 with low adhesion and the cathode 3023 of the light-emitting element. The base material of the first color film layer 3041 and the base material of the second color film layer 3042 are substantially the same, the adhesion between the first color film layer 3041 and the second color film layer 3042 is greater than the adhesion between the second color film layer 3042 and the cathode 3023 of the light-emitting element 302, so that, compared with the case where the second color film layer 3042 does not cover the first color film layer 3041 at all, the second color film layer 3042 partially covering the first color film layer 3041 can reduce the possibility of the entirety of the first color film layer 3041 and the second color film layer 3042 peeling off from the cathode 3023 of the light-emitting element 302. In addition, because the second color film layer 3402 has low adhesion, it has good fluidity, in the process of forming the second color film layer 3042, the content of air bubbles on the surface of the entirety of the first color film layer 3041 and the second color film layer 3042 away from the light-emitting element 302 can be reduced, and the uniformity of the film thickness of the entirety of the first color film layer 3041 and the second color film layer 3042 at the position where the two layers overlap is improved.

For example, in a pixel unit, one edge of the second color film layer 3042 overlaps with the edge of the first color film layer 3041 adjacent to the second color film layer 3042, so that the position where the second color film layer 3042 and the first color film layer 3041 overlap can block the light transmission, which can play a role similar to the black matrix, and solve the problem caused by the lack of the black matrix, and also eliminating the risk of scrapping the silicon-based OLED microdisplay caused by the preparation of the black matrix.

For example, the display substrate shown in FIG. 9A may further include a passivation layer (not shown) and a package layer (not shown) disposed between the light-emitting element 302 and the color film layer 304, in order to reduce or avoid the adverse effects of water, oxygen, etc. on the performance of the cathode 3023 and the light-emitting function layer 3022.

For example, the display substrate shown in FIG. 9A may further include a filling material and a cover plate that are sequentially disposed on the side of the color film layer away from the base substrate.

For example, for the materials and properties of the passivation layer, the package layer, the filling material, and the cover plate, reference may be made to the related descriptions in the foregoing embodiments, and details are not described herein again.

Figure 9B:
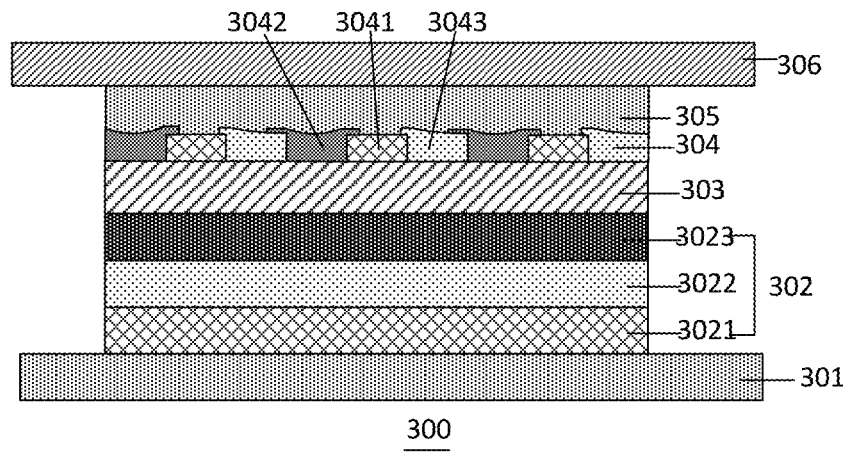
FIG. 9B is a schematic diagram of a cross-sectional structure of another display substrate provided by an embodiment of the present disclosure.

For example, FIG. 9B is a schematic diagram of a cross-sectional structure of another display substrate provided by an embodiment of the present disclosure. The display substrate 300 shown in FIG. 9B is described by using the color film layer 304 including the first color film layer 3041, the second color film layer 3042, and the third color film layer 3043 as an example.

As shown in FIG. 9B, the display substrate 300 includes a base substrate 301; a light-emitting element 302, a passivation layer 303, a color film layer 304, a filling material 305, and a cover plate 306 that are sequentially stacked on the base substrate 301. For example, the base substrate 301 is a silicon substrate, and the materials of the other layers may refer to the related descriptions in the above, and details are not described herein again.

For example, in each pixel unit, the color film layer 304 includes a first color film layer 3041, a second color film layer 3042 partially covering the surface on one side of the first color film layer 3041, and a third color film layer 3043 partially covering the surface on the other side of the first color film layer 3041. In two adjacent pixel units, the second color film layer 3042 in one pixel unit partially covers the third color film layer 3043 in the pixel unit adjacent to the one pixel unit. The adhesion of the third color film layer 3043 is greater than the adhesion of the second color film layer 3042 and less than the adhesion of the first color film layer 3041.

Figure 10A:
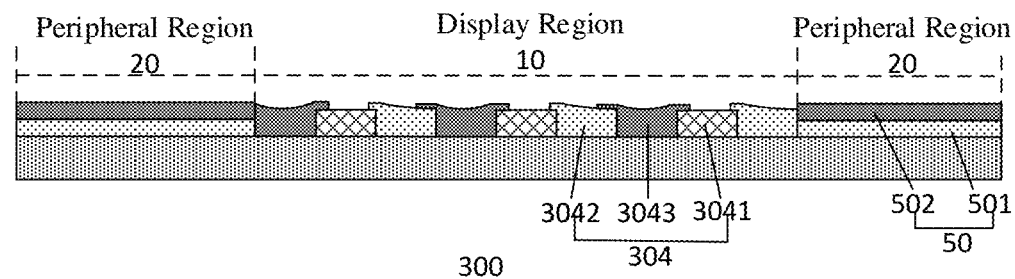
FIG. 10A is a schematic diagram of a cross-sectional structure of yet another display substrate provided by an embodiment of the present disclosure.

For example, FIG. 10A is a schematic diagram of a cross section of yet another display substrate provided by an embodiment of the present disclosure. As shown in FIG. 10A, the display substrate 300 includes a display region 10 and a peripheral region 20 surrounding the display region 10 outside. The first color film layer 3041, the second color film layer 3042, and the third color film layer 3043 are provided in the display region 10, the peripheral region 20 is provided with a black matrix 50, the black matrix 50 includes a first sub-layer 501 and a second sub-layer 502 disposed in a stack, the first sub-layer 501 and one of the first color film layer 3041, the second color film layer 3042 and the third color film layer 3043 are provided in a same layer and by a same material, and the second sub-layer 502 and another of the first color film layer 3041, the second color film layer 3042, and the third color film layer 3043 are provided in a same layer and by a same material. For example, in FIG. 10A, the description is made by using the case where the first sub-layer 501 and the second color film layer 3042 are provided in the same layer and by the same material, and the second sub-layer 502 and the third color film layer 3043 are provided in the same layer and by the same material as an example.

It is to be noted that, in the peripheral region 20, the first sub-layer 501 and second sub-layer 502 being disposed in a stack may be that the first sub-layer 501 and the second sub-layer 502 substantially completely overlap, or the first sub-layer 501 and the second sub-layer 502 have an overlap ratio of about 80%.

Figure 10B:
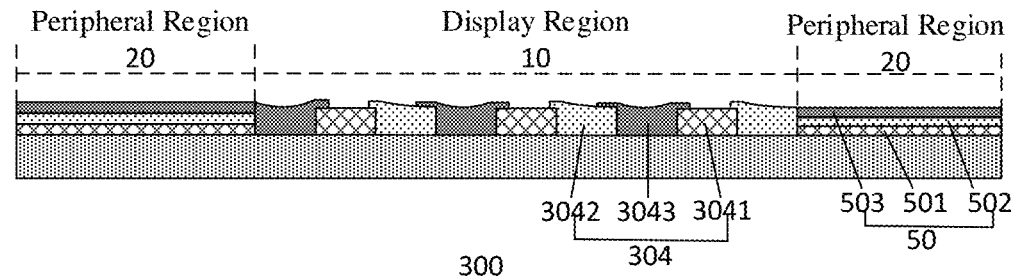
FIG. 10B is a schematically cross-sectional view of yet another display substrate provided by an embodiment of the present disclosure.

For example, FIG. 10B is a schematic diagram of a cross section of yet another display substrate provided by an embodiment of the present disclosure. As shown in FIG. 10B, the display substrate includes a display region 10 and a peripheral region 20 surrounding the the display region 10 outside. The first color film layer 3041, the second color film layer 3042, and the third color film layer 3043 are provided in the display region 10, the peripheral region 20 is provided with a black matrix 50, and the black matrix 50 includes a first sub-layer 501 and a second sub-layer 502 disposed in a stack. The first sub-layer 501 and the first color film layer 3041 are provided in the same layer, the second sub-layer 502 and the second color film layer 3042 are provided in the same layer, and the third sub-layer 503 and the third color film layer 3043 are provided in the same layer.

For example, the display region 10 includes a plurality of pixel units, and each pixel unit includes the first color film layer 3041, the second color film layer 3042, and the third color film layer 3043. In each pixel unit, the first color film layer 3041 is located between the second color film layer 3042 and the third color film layer 3043, the first color film layer 3041 and the second color film layer 3042 at least partially do not overlap, the first color film layer 3041 and the third color film layer 3043 at least partially do not overlap, and the second color film layer 3042 and the third color film layer 3043 do not overlap at all, so that the first color film layer 3041, the second color film layer 3042, and the third color film layer 3043 can all emit monochromatic light of the corresponding color. The second color film layer 3042 of at least one pixel unit partially covers the third color film layer 3043 of the adjacent pixel unit, which can ensure that the position overlapping with the adjacent pixel unit can also play a role in blocking light transmission, and solve the problem caused by the lack of the black matrix.

For example, in each pixel unit, the second color film layer 3042 partially covers the first color film layer 3041 to form a first overlap region, and the third color film layer 3043 partially covers the first color film layer 3041 to form a second overlap region, both the first overlap region and the second overlap region are opaque, that is, as shown in FIGS. 10A and 10B, one edge of the second color film layer 3042 overlaps the edge of the first color film layer 3041 adjacent to the second color film layer, and another edge of the second color film layer 3042 overlaps the edge of the third color film layer 3043 adjacent thereto, so that both the position where the second color film layer 3042 and the first color film layer 3041 overlap, i.e., the first overlap region, and the position where the second color film layer 3042 and the third color film layer 3042 overlap, i.e., the second overlap region, can block the light transmission, and they can play a role similar to the black matrix, and solve the problem caused by the lack of the black matrix, and also eliminating the risk of scrapping the silicon-based OLED microdisplay caused by the preparation of the black matrix.

For example, in the display region 10, the first color film layer 3041, the second color film layer 3042, and the third color film layer 3043 are arranged in an array; in the peripheral region 20, the black matrix 50 has a ring-shaped pattern.

Figure 11:
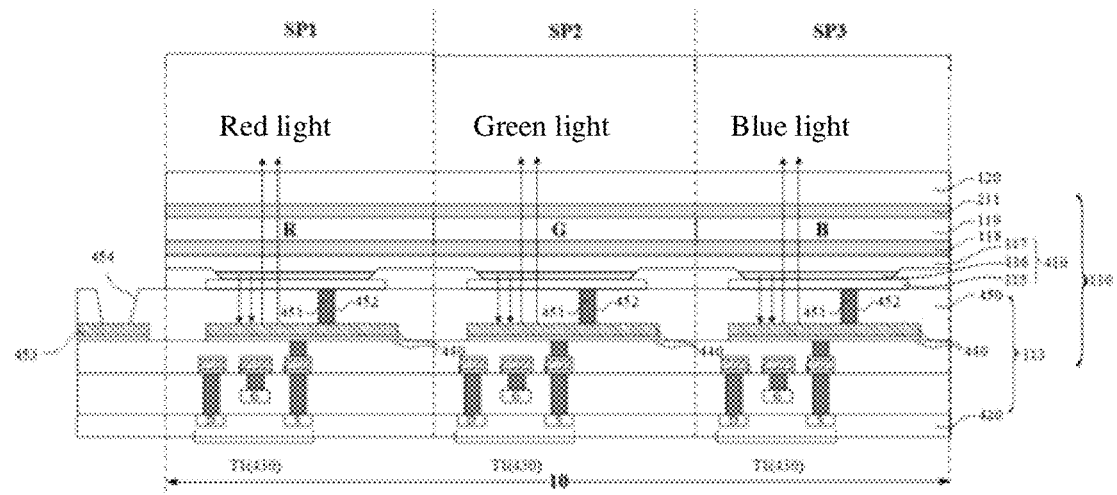
FIG. 11 is a schematically partial cross-sectional view of yet another display substrate provided by an embodiment of the present disclosure.

For example, FIG. 11 is a schematic diagram of a partial cross-section of a display substrate provided by yet another embodiment of the present disclosure. The display substrate includes a display region 10. The display region 10 includes a plurality of pixel units configured for display. The display region 10 is, for example, an AA (Active Area). For example, the display region 10 is provided with a pixel circuit, an organic light-emitting material, etc., so as to display under the drive of a scan signal and a data signal.

For example, as shown in FIG. 11, the display substrate includes an array substrate 110, the array substrate 110 includes a silicon substrate 113 and a light-emitting element 410. For example, the silicon substrate 113 includes a silicon-based base substrate 420, a pixel circuit 430, a light reflection layer 440, and an insulating layer 450 that are sequentially stacked. The light-emitting element 410 includes an anode 115 (i.e., a first electrode of the light-emitting element), a light-emitting function layer 116 and a cathode 117 (i.e., a second electrode of the light-emitting element) that are sequentially stacked on the insulating layer 450 included in the silicon substrate 113. The anode 115 is a transparent electrode layer. For example, the insulating layer 450 is light-transmissive so that the light emitted by the light-emitting functional layer 116 penetrates therethrough and reaches the light reflection layer 440 to be reflected by the light reflection layer 440. For example, the material of the light reflection layer 440 is metal aluminum.

For example, the insulating layer 450 includes a via hole 452 filled with a metal member 451, and the light reflection layer 440 is electrically connected to the anode 115 through the metal member 451. In this way, by forming a conductive channel between the light reflection layer 440 and the anode 115 in the insulating layer 450, it is advantageous to transmit the electrical signal provided by the pixel circuit 430 to the anode 115 through the light reflection layer 440 in the silicon substrate 113. In this way, it is advantageous to realize the control of the light-emitting element 410 by the pixel circuit 430, and the structure of the display substrate is more compact, which is advantageous to the miniaturization of the display substrate. Further, for example, the metal member 451 is made of a metal material, such as tungsten metal, and a via hole filled with tungsten metal is also called a tungsten via (W-via) hole. For example, in the case where the thickness of the insulating layer 450 is relatively large, the formation of a tungsten via hole in the insulating layer 450 can ensure the stability of the conductive path, and because the process of preparing the tungsten via hole is mature, the flatness of the surface of the obtained insulating layer 450 is good, which is beneficial to reduce the contact resistance between the insulating layer 450 and the anode 115. It can be understood that the tungsten via hole is not only suitable for electrical connection between the insulating layer 450 and the anode 115, but also suitable for electrical connection between the light reflection layer 440 and the pixel circuit 430, and other wiring layers, such as electrical connections between the electrodes of the driving transistor, the switching transistor and the capacitor in the pixel circuit and the layer where the signal line is located.

For example, the silicon substrate 113 includes the pixel circuit 430, the pixel circuit 430 and the light reflection layer 440 are electrically connected to each other, and the pixel circuit 430 is used to drive the light-emitting element 410 to emit light. The pixel circuit 430 at least includes a driving transistor T1 and a switching transistor (not shown), and the driving transistor T1 and the light reflection layer 440 are electrically connected to each other. In this way, the electric signal driving the light-emitting element 410 can be transmitted to the anode 115 through the light reflection layer 440, so as to control the light-emitting element 410 to emit light. For example, the driving transistor T1 includes a gate electrode G, a source electrode S, and a drain electrode D. The source electrode S of the driving transistor T1 is electrically connected to the light reflection layer 440. When the driving transistor T1 is in the 'on' state and is in the saturated state, under the control of the data voltage applied by the gate electrode, the driving current provided by the pixel circuit can be transmitted to the anode 115 through the source electrode S of the driving transistor T1 and the light reflection layer 440. Because a voltage difference is formed between the anode 115 and the cathode 117, holes and electrons are respectively injected into the light-emitting functional layer 116 and recombined, so that the light-emitting functional layer 116 emits light under the action of the electric field. It can be understood that, in the driving transistor T1, the positions of the source electrode S and the drain electrode D are interchangeable, so that the light reflection layer 440 and one of the source electrode S and the drain electrode D may be electrically connected to each other.

Figure 12A:
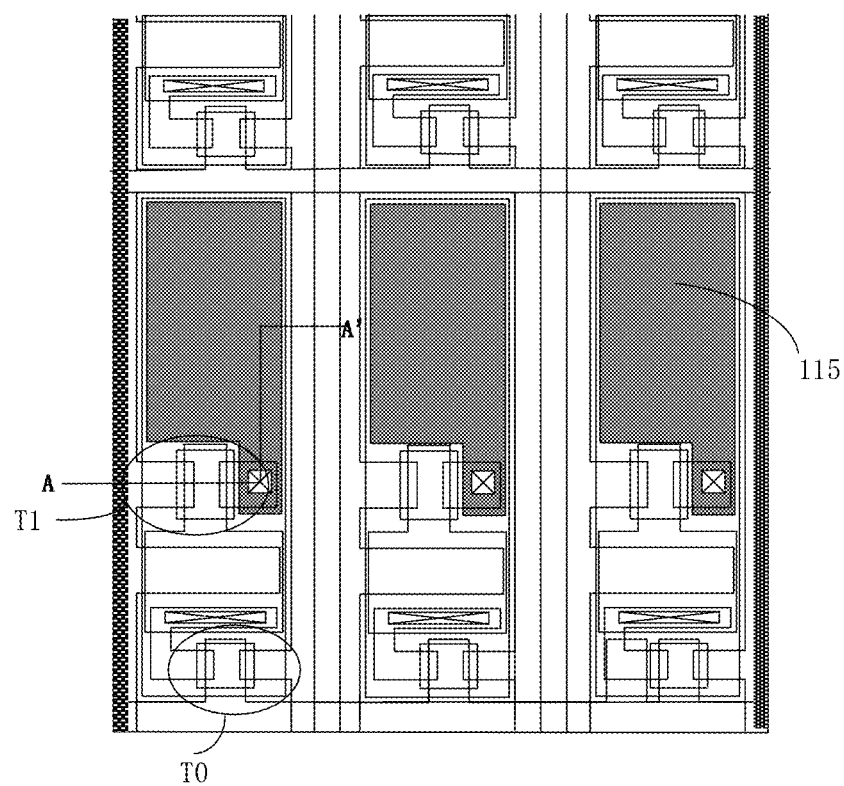
FIG. 12A is a schematically structural plan view of a display substrate according to an embodiment of the present disclosure.
Figure 12B:
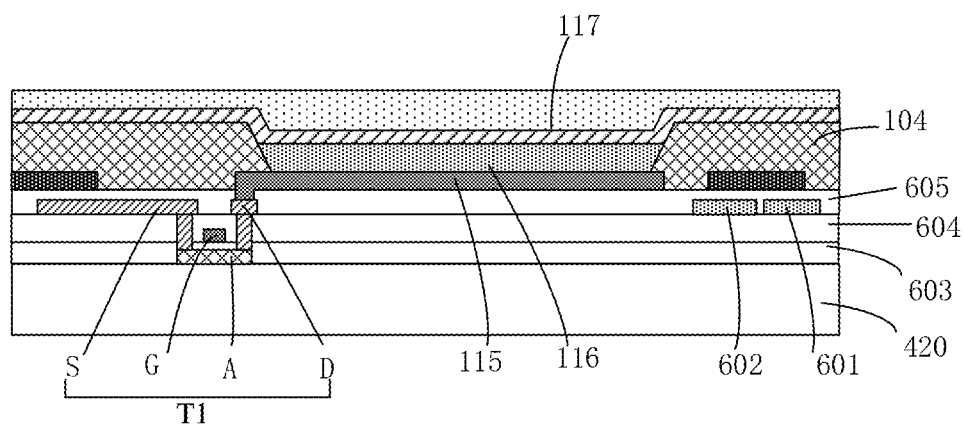
FIG. 12B is a schematic diagram of the cross-sectional structure of the display substrate in FIG. 12A.

For example, FIG. 12A is a schematic diagram of a planar structure of a display substrate provided by an embodiment of the present disclosure, and FIG. 12B is a schematic diagram of a cross-sectional structure of the display substrate in FIG. 12A. As shown in FIGS. 12A and 12B, the silicon substrate 113 further includes a power line 601, a data line 602, and a gate line (not shown) connected to the gate electrode G of the driving transistor T1 provided on the silicon base substrate 420. A pixel circuit is provided in a region defined by the intersection of the gate line and the data line 602, and the pixel circuit includes a switching transistor T0, a driving transistor T1, and a light-emitting element (including the anode 115, the cathode 117, and a light-emitting functional layer 116). The switching transistor T0 includes a gate electrode, a source electrode, a drain electrode, and an active layer, the gate electrode of the switching transistor T0 is connected to the gate line, the drain electrode of the switching transistor T0 is connected to the data line 602, and the source electrode of the switching transistor T0 is connected to the gate electrode G of the driving transistor. The driving transistor T1 is connected to the switching transistor T0, the power supply line 601, and the light-emitting element. The driving transistor T1 further includes an active layer A, a gate insulating layer 603, the gate electrode G, and a first insulating layer 604 are formed on the active layer A, the source electrode S and the drain electrode D are formed on the first insulating layer 604. The source electrode S and the drain electrode D are electrically connected to the active layer A, respectively. A second insulating layer 605 is formed on the source electrode S and the drain electrode D, and the anode 115 is formed on the second insulating layer 605. The light-emitting element further includes a pixel definition layer 104 formed between the anode 115 and the cathode 117, the pixel definition layer 104 may be used to isolate two adjacent sub-pixel units, and the pixel definition layer 104 includes a plurality of openings, and the plurality of openings are used to vaporize the material of the light-emitting functional layer to form the light-emitting functional layer.

For example, the power line 601 and the data line 602 may be formed of the same material and in the same layer as the source electrode and the drain electrode.

For example, the display substrate includes a plurality of sub-pixels (or pixel units), and three sub-pixels, i.e., a red sub-pixel SP1, a green sub-pixel SP2, and a blue sub-pixel SP3, are exemplarily shown in FIG. 11. Each sub-pixel corresponds to a sub-pixel region of the display substrate, that is, each sub-pixel is provided with the independent light-emitting element 410 and the driving transistor T1.

For example, the insulating layers 450 in the three sub-pixels are integrally formed to facilitate preparation. For example, as shown in FIG. 11, the insulating layer 450 further includes an opening 454 exposing a pad 453, the arrangement of the opening 454 facilitates electrical connection and signal communication between the pad 453 and an external circuit. For example, the opening 454 exposing the pad 453 is located in the peripheral region 140. The colors of the sub-pixels in the display substrate are only schematic, and may also include other colors, such as yellow and white.

For example, as shown in FIG. 11, the array substrate 110 further includes a second thin film package layer 118, a color film layer 119 and a first thin film package layer 211 that are sequentially disposed on the cathode 117. That is, the color film layer 119 is interposed between the first thin film package layer 211 and the second thin film package layer 118. The display substrate further includes a cover plate 120, and the cover plate 120 is disposed on the second thin film package layer 211. For example, the first thin film package layer 211 is located on the side of the cathode 117 away from the silicon base substrate 420. The color film layer 119 is located on the side of the first thin film package layer 118 away from the silicon base substrate 420, and includes a first color film layer (e.g., a green film layer) and a second color film layer (e.g., a blue film layer), and a third color film layer (e.g., a red film layer). The second thin film package layer 211 and the cover plate 120 are located on the side of the color film layer 119 away from the silicon base substrate 420. For the specific materials of the first thin-film package layer 118, the color film layer 119, the second thin-film package layer 211, and the cover plate 120, conventional materials in the art can be used, which will not be described in detail here.

For example, in the display substrate provided by the embodiments of the present disclosure, the light-emitting element 410 including the anode 115, the light-emitting functional layer 116, and the cathode 117, the first thin film package layer 118, the color film layer 119, the second thin film package layer 211, and the cover plate 120 can be separately prepared on the silicon substrate 113. In addition, in the same process, the insulating layer 450 above the pad 453 can also be etched to expose the pad 453 and enable it to be bonded or wire-bonded with a flexible printed circuit board (FPC). In this way, in the embodiments of the present disclosure, for example, the silicon substrate 113 including the light reflection layer 440 and the insulating layer 450 and suitable for forming the light-emitting element 430 may be manufactured by a wafer factory, and then structures on the silicon substrate may be prepared by a display substrate factory, which not only reduces the difficulty of forming the light reflection layer 440, but also facilitates the subsequent process of the panel factory.

Figure 13:
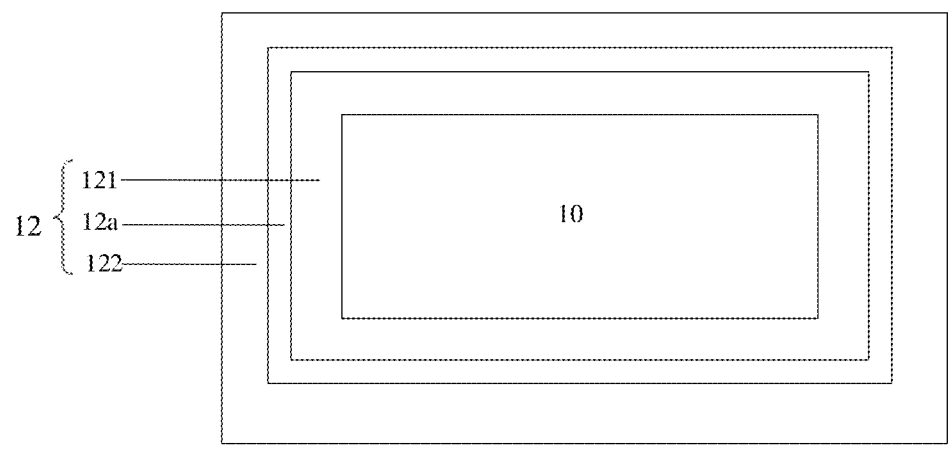
FIG. 13 is a schematic diagram of a region division of a display substrate provided by an embodiment of the present disclosure.

For example, FIG. 13 is a schematic diagram of a region division of a display substrate according to an embodiment of the present disclosure. As shown in FIG. 13, the display substrate includes a display region 10 and a peripheral region 12, and the peripheral region 12 includes a connection electrode region 12a, so that the peripheral region 12 includes three regions: the connection electrode region 12a, a first dummy region 121, and a second dummy region 122. The first dummy region 121 is located between the connection electrode region 12a and the display region 10, and the second dummy region 122 is located on the side of the connection electrode region 12a away from the display region 10. As shown in FIG. 12, the second dummy region 122 is located on the side of the connection electrode region 12a away from the first dummy region 121.

Figure 14:
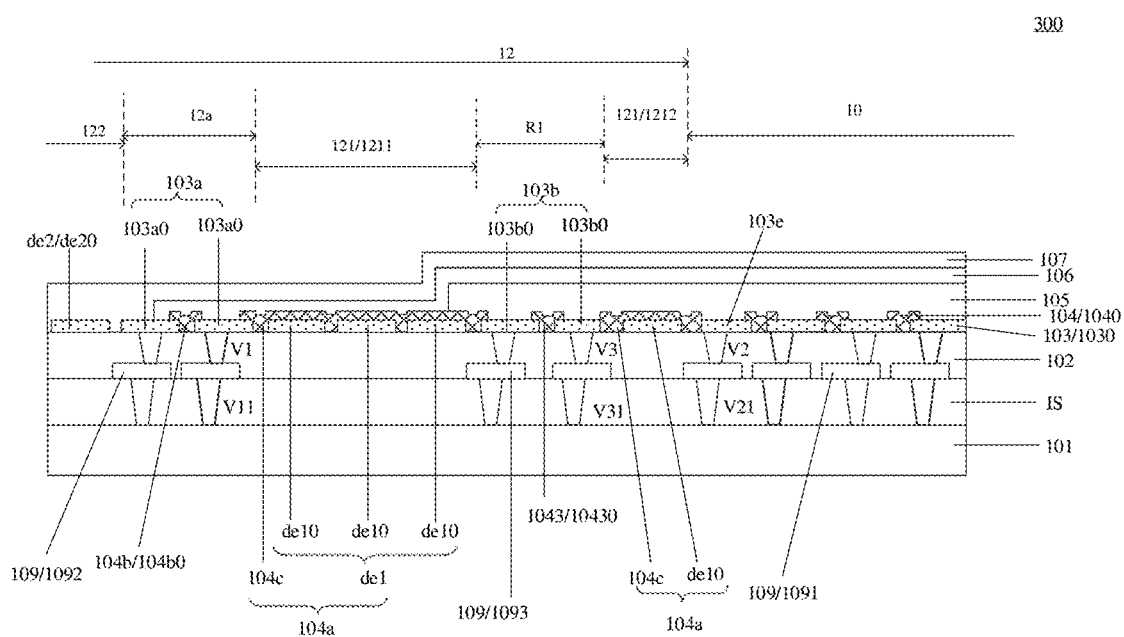
FIG. 14 is a schematically cross-sectional view of a display substrate provided by an embodiment of the present disclosure.

For example, FIG. 14 is a schematic cross-sectional view of a display substrate provided by an embodiment of the present disclosure. As shown in FIG. 14, the display substrate 300 includes a first electrode pattern 103 located in the display region 10 of the display substrate and including a plurality of first electrodes 1030 (e.g., anodes) spaced apart from each other; a connection electrode pattern 103a in the connection electrode region 12a of the display substrate and including a plurality of connection electrodes 103a0; and a first dummy electrode pattern de1 located in the first dummy region 121 of the display substrate and including a plurality of first dummy electrodes de10.

As shown in FIGS. 13 and 14, the connection electrode region 12a surrounds the display region 10, and the first dummy region 121 is located between the connection electrode region 12a and the display region 10. The connection electrode pattern 103a surrounds the first electrode pattern 103, and the first dummy electrode pattern de1 surrounds the first electrode pattern 103. The first dummy electrode pattern de1 is located between the connection electrode pattern 103a and the first electrode pattern 103.

For example, as shown in FIG. 14, the display substrate provided by an embodiment of the present disclosure further includes a second electrode 106 (e.g., a cathode), the second electrode 106 is connected to the connection electrode 103a0; the peripheral region 12 of the display substrate surrounds the display region 10, the peripheral region 12 includes the connection electrode region 12a and the first dummy region 121; the second electrode 106 is located in the display region 10 and the peripheral region 12, and the second electrode 106 and the first electrode pattern 103 are spaced apart from each other.

For example, in the connection electrode region 12a of the display substrate, the projection (not shown) of the color filter layer on the base substrate completely covers the projection of the plurality of connection electrodes 103a0 on the base substrate.

For example, the orthographic projection of the first electrode pattern 103 and the second electrode 106 on the base substrate 101 is located within the orthographic projection of the color filter layer (not shown) on the base substrate 101.

For example, the pattern density of the first electrode pattern 103, the pattern density of the connection electrode pattern 103a, and the pattern density of the first dummy electrode pattern de1 are the same, and the shape of the first electrode 1030 of the first electrode pattern 103, the shape of the connection electrode 103a0 of the connection electrode pattern 103a, and the shape of the first dummy electrode de10 of the first dummy electrode pattern de1 are the same. In this way, the consumption rate of the etching solution or the developing solution in each region during etching or developing can be approximately the same to ensure the uniformity of the process.

For example, as shown in FIG. 14, the display substrate further includes a sensor electrode pattern 103b, and the sensor electrode pattern 103b is located in a sensor region R1 of the display substrate and includes a plurality of sensor electrodes 103b0. For example, the pattern density of the sensor electrode pattern 103b and the pattern density of the first electrode pattern 103 are the same, and the pattern shape of the sensor electrode 103b0 and the pattern shape of the first electrode pattern 103 are the same.

It is to be noted that the pixel structure of the sensor region R1 is the same as the pixel structure of the display region 10, and in the sensor region R1, the sensor electrode 103b0 is electrically connected to the pixel circuit through a tungsten via hole V3 and a via hole V31. The pixel structure of the sensor region R1 is different from the pixel structures of the first dummy sub-region 1211, the second dummy sub-region 1212, and the second dummy region 122. The first dummy electrode pattern de1 of the first dummy sub-region 1211, the first dummy electrode de10 of the second dummy sub-region region 1212, and the second dummy electrode pattern de2 of the second dummy region 122 are not connected to other circuits through via holes.

For example, the pixel structure of the sensor region R1 is used to sense the voltage of the first electrode 1030 of the display region 10 and used to realize circuit compensation. For example, the voltage of the first electrode 1030 of the display region 10 may be sensed by connecting a compensation transistor to a temperature sensor.

For example, as shown in FIG. 14, the second dummy sub-region 1212 in the first dummy region 121 is used to isolate the sensor region R1 and the display region 10. The first dummy sub-region 1211 in the first dummy region 121 is used for transition, so that the second electrode 106 and the connection electrode 103a0 in the connection electrode region 12a are better overlapped.

For example, as shown in FIG. 14, the display substrate further includes a second dummy electrode pattern de2 located in the second dummy region 122 of the display substrate and including a plurality of second dummy electrodes de20; the second dummy region 122 is located on the side of the connection electrode region 12a away from the display region 10. For example, the pattern density of the second dummy electrode pattern de2 and the pattern density of the first electrode pattern 103 are the same, and the second dummy electrode pattern de2 and the first electrode pattern 103 are separated by a pixel defining layer.

For example, both the dummy pixels in the first dummy sub-region 1211 of the first dummy region 121 and the second dummy region 122 are provided in two rows. For example, the edge in the row direction is two rows, and the edge in the column direction is two columns.

For example, as shown in FIG. 14, the second dummy sub-region 1212 is located between the sensor region R1 and the display region 10; the portion of the first dummy region 121 between the sensor region R1 and the connection electrode region 12a is the first dummy sub-region 1211; a first filling layer 104a is formed in the first dummy sub-region 1211, the first filling layer 104a includes a plurality of first dummy electrodes de10 and an insulating wrapping layer 104c, the first electrode pattern 103 includes an edge first electrode 103e adjacent to the connecting electrode 103a0, and the insulating wrapping layer 104c is in contact with the connection electrode 103a0 and the edge first electrode 103e, respectively. For example, the material of the insulating wrapping layer 104c is the same as that of the pixel defining layer.

For example, as shown in FIG. 14, the second electrode 106 is in contact with the insulating wrapping layer 104c.

For example, as shown in FIG. 14, a first thin-film package layer 107 is further provided on the side of the second electrode 106 away from the base substrate 101, and the first thin-film package layer 107 can prevent water and oxygen from entering the light-emitting function layer 105.

For example, as shown in FIG. 14, the edge first electrode 103e and the plurality of first dummy electrodes de10 are insulated from each other.

For example, as shown in FIG. 14, the display substrate further includes a pixel definition layer 104, and the pixel definition layer 104 includes a plurality of pixel definition portions 1040, and each of the plurality of pixel definition portions 1040 is located between adjacent first electrodes 1030.

For example, as shown in FIG. 14, the insulating wrapping layer 104c and the pixel definition layer 104 are located in the same layer, and can be formed by the same film layer using the same patterning process to save the manufacturing process.

For example, as shown in FIG. 14, the first electrode pattern 103 and the connection electrode pattern 103a are located in the same layer, and can be formed by the same film layer using the same patterning process to save the manufacturing process.

For example, as shown in FIG. 14, the display substrate further includes a second filling layer 104b, the second filling layer 104b includes at least one second filling portion 104b0, and the second filling portion 104b0 is located between adjacent connection electrodes 103a0. For example, the second filling layer 104b is an insulating layer. For example, as shown in FIG. 14, the second filling portions 104b0 are in contact with the adjacent connection electrodes 103a0, respectively.

For example, as shown in FIG. 14, the second filling layer 104b and the first filling layer 104a are located in the same layer, and can be formed by the same film layer using the same patterning process to save the manufacturing process.

For example, as shown in FIG. 14, the display substrate further includes a third filling layer 1043, the third filling layer 1043 includes a plurality of third filling portions 10430, and the third filling portion 10430 is located between at least one of the adjacent sensor electrodes 103b0, the adjacent sensor electrode 103b0 and the first dummy electrode. FIG. 14 is described by using the case where the third filled portion 10430 is located between adjacent sensor electrodes 103b0 as an example.

For example, as shown in FIG. 14, the third filling layer 1043 and the pixel definition layer 104 are located in the same layer, and can be formed by the same film layer using the same patterning process to save the manufacturing process.

For example, as shown in FIG. 14, the display substrate further includes a light-emitting functional layer 105, which is located between the first electrode pattern 103 and the second electrode 106, and the light-emitting functional layer 105 is in contact with the first filling layer 104a. For example, the light-emitting functional layer 105 is in contact with a part of the first filling layer 104a. For example, in the display region, the color film layer (not shown) covers the light-emitting functional layer 105.

For example, as shown in FIG. 14, the light-emitting functional layer 105 is in contact with the sensor electrode pattern 103b. The light-emitting functional layer 105 is in contact with the first dummy electrode located in the second dummy sub-region 1212.

As shown in FIG. 14, an insulating layer IS is further provided on the base substrate 101, and a conductive pattern 109 is provided on the insulating layer IS. The conductive pattern 109 includes a first conductive portion 1091, a second conductive portion 1092 and a third conductive portion 1093. The insulating layer IS includes a via hole V11, a via hole V21, and a via hole V31. The via hole V11, the via hole V21, and the via hole V31 are filled with conductive materials to form connection members. The first electrode 1030 is connected to the connection member in the via hole V21 through the first conductive portion 1091. The connection electrode 103a0 is connected to the connection member in the via hole V11 through the second conductive portion 1092. The sensor electrode 103b0 is connected to the connection member in the via hole V31 through the third conductive portion 1093.

For example, the portion of the first insulating layer 102 that overlaps with the plurality of first dummy electrodes de10 in the direction perpendicular to the base substrate 101 is not provided with a via hole.

For example, the portion of the first insulating layer 102 that overlaps with the plurality of second dummy electrodes de20 in the direction perpendicular to the base substrate 101 is not provided with a via hole.

For example, the portion of the first insulating layer 102 that overlaps with the plurality of connection electrodes 103a0 in the direction perpendicular to the base substrate 101 is provided with a via hole V1.

For example, the portion of the first insulating layer 102 that overlaps the plurality of first electrodes 1030 in the direction perpendicular to the base substrate 101 is provided with a via hole V2.

For example, the portion of the first insulating layer 102 that overlaps the plurality of sensor electrodes 1030 in the direction perpendicular to the base substrate 101 is provided with a via hole V3.

The embodiments of the present disclosure provide a color film layer and a preparation method thereof, a display substrate and a preparation method thereof, which have at least one of the following beneficial effects:

(1) The preparation method of the color film layer provided in at least one embodiment of the present disclosure can reduce the possibility of the color film layer peeling off from the bearing layer.

(2) The preparation method of the color film layer provided in at least one embodiment of the present disclosure can reduce the content of air bubbles on the surface of the entirety of the first color film layer and the second color film layer away from the bearing layer, and improve the uniformity of the film thickness of the entirety of the first color film layer and the second color film layer at the position where the two layers overlap.

(3) In the display substrate provided by at least one embodiment of the present disclosure, the position where the second color film layer and the first color film layer overlap and the position where the second color film layer and the third color film layer overlap can block the light transmission, which can play a role similar to the black matrix, and solve the problem caused by the lack of the black matrix, and avoid the risk of the scrapping of the silicon-based OLED microdisplay caused by the preparation of the black matrix.

(4) In the display substrate provided in at least one embodiment of the present disclosure, a peripheral region includes a black matrix, and the black matrix includes a first sub-layer and a second sub-layer that are stacked, the first sub-layer and one of the first color film layer, the second color film layer, and the third color film layer are provided in the same layer and made by the same material, and the second sub-layer and another of the first color film layer, the second color film layer, and the third color film layer are provided in the same layer and made by the same material, which reduces the process of preparing the black matrix in the peripheral region, and simplify the process steps.

(5) In the display substrate provided in at least one embodiment of the present disclosure, a black matrix is provided in a peripheral region, and the black matrix includes a first sublayer, a second sublayer, and a third sub-layer that are stacked, the first sub-layer and the first color film layer are provided in the same layer, the second sub-layer and the second color film layer are provided in the same layer, and the third sub-layer and the third color film layer are provided in the same layer, which reduces the process of preparing the black matrix in the peripheral region, and simplify the process steps.

The following statements should be noted:

(1) The accompanying drawings involve only the structure(s) in connection with the embodiment(s) of the present disclosure, and other structure(s) can be referred to common design(s).

(2) For the purpose of clarity, in the accompanying drawings for illustrating the embodiment(s) of the present disclosure, the thickness and size of a layer or a region may be enlarged or shrinked, that is, the drawings are not drawn as actual scales. It is to be understood that, when a component or element, such as a layer, film, region, substrate or the like is referred to be "on" or "under" another component or element, it may be directly on or under the another component or element, or a component or element is interposed therebetween.

(3) Without conflicting with each other, the embodiments of the present disclosure and the elements in the embodiment(s) may be combined with each other to obtain new embodiments.

The described above is related to the specific embodiments of the disclosure only, while the scope of the disclosure is not limited thereto. The scope of the disclosure is defined by scope of the claims.

What is claimed is:

1. A display substrate comprising a bearing layer and a plurality of repeating units, wherein each of the repeating units comprises a green film layer, a red film layer, and a blue film layer, and the green film layer, the red film layer and the blue film layer are provided on the bearing layer and directly contact a first surface of the bearing layer,
on a plane parallel to the first surface of the bearing layer, in each of the repeating units, the red film layer is provided on a first side of the green film layer, and the blue film layer is provided on a second side of the green film layer opposite to the first side;
at least one of the red film layer and the blue film layer covers a part of the green film layer; and
at least one part of the green film layer does not overlap with the red film layer and the blue film layer, wherein adhesion of the green film layer is greater than adhesion of the red film layer and adhesion of the blue film layer.

2. The display substrate according to claim 1, wherein in each of the repeating units, the green film layer is located between the red film layer and the blue film layer, the green film layer and the red film layer do not overlap at least partially, the green film layer and the blue film layer do not overlap at least partially, and the red film layer and the blue film layer do not overlap at all,
the blue film layer of at least one repeating unit partially covers the red film layer of an adjacent repeating unit; and
wherein in each of the repeating units, the red film layer and a part of the green film layer overlap to form a first overlap region; and the blue film layer and a part of the green film layer overlap to form a second overlap region.

3. The display substrate according to claim 2, wherein the first overlap region and the second overlap region respectively account for 5%-20% of a total area of the green film layer, and
wherein the first overlap region and the second overlap region respectively account for 10% of the total area of the green film layer.

4. The display substrate according to claim 2, wherein the first overlap region and the second overlap region do not overlap;
wherein a shape of a cross section of the green film layer perpendicular to the bearing layer is a rectangle with rounded corners; a portion of the red film layer overlapping with part of the green film layer is protruded toward a side away from the green film layer; a portion of the blue film layer overlapping with a part of the green film layer is protruded toward a side away from the bearing layer, and a portion of the blue film layer overlapping with the red film layer of the adjacent repeating unit is protruded toward a side away from the bearing layer; and
wherein edges of both sides of the blue film layer are convex and a middle portion of the blue film layer is concave; and relative to the bearing layer, a height of the red film layer gradually decreases from an overlap position of the red film layer and the green film layer toward a direction away from the green film layer.

5. The display substrate according to claim 4, wherein, in a first overlap region formed by overlapping the red film layer and the part of the green film layer, a total thickness of a stack of the red film layer and the green film layer is greater than a thickness of a middle region of the red film layer and a thickness of a middle region of the green film layer, and in the first overlap region formed by overlapping the red film layer and the part of the green film layer, a thickness of the red film layer is less than the thickness of the middle region of the red film layer; or
wherein, in a second overlap region formed by overlapping the blue film layer and the part of the green film, a total thickness of a stack of the blue film layer and the green film layer is respectively greater than a thickness of a middle region of the blue film layer and a thickness of a middle region of the green film layer, and in the second overlap region formed by overlapping the blue film layer and the part of the green film, a thickness of the blue film layer is less than the thickness of the middle region of the blue film layer.

6. The display substrate according to claim 4, wherein a surface of the blue film layer away from the bearing layer is depressed toward the bearing layer, an orthographic projection of the blue film layer on the bearing layer is a rectangle with rounded corners, and a thickness of an edge region of the blue film layer is less than a thickness of a middle region of the blue film layer; or
a surface of the green film layer away from the bearing layer is protruded away from the bearing layer, an orthographic projection of the green film layer on the bearing layer is a rectangle with rounded corners, and a thickness of an edge region of the green film layer is less than a thickness of a middle region of the green film layer; or
an orthographic projection of the red film layer on the bearing layer is a rectangle with rounded corners, a thickness of an edge region of the red film layer is less than a thickness of a middle region of the red film layer, and in each of the repeating units, a thickness of the red film layer increases first and then decreases in a direction from the blue film layer to the red film layer.

7. A display substrate, comprising:
a base substrate; and
a light-emitting element and a color film layer sequentially stacked on the base substrate; wherein the color film layer comprises a first color film layer and a second color film layer provided on a side of the light-emitting element away from the base substrate, the second color film layer partially covers the first color film layer, and adhesion of the first color film layer is greater than adhesion of the second color film layer.

8. The display substrate according to claim 7, further comprising a third color film layer, wherein the third color film layer partially covers the first color film layer, the second color film layer partially covers the third color film layer; and adhesion of the third color film layer is greater than the adhesion of the second color film layer and less than the adhesion of the first color film layer;
further comprising a display region and a peripheral region surrounding the display region outside,
wherein the first color film layer, the second color film layer, and the third color film layer are provided in the display region, the peripheral region is provided with a black matrix, the black matrix comprises a first sub-layer and a second sub-layer that are stacked, the first sub-layer is provided in a same layer and in a same material as one of the first color film layer, the second color film layer, and the third color film layer, and the second sub-layer is provided in a same layer and in a same material as another layer of the first color film layer, the second color film layer, and the third color film layer; or
wherein the first color film layer, the second color film layer, and the third color film layer are provided in the display region, the peripheral region is provided with a black matrix, the black matrix comprises a first sublayer, a second sublayer, and a third sub-layer that are stacked, the first sub-layer is provided in a same layer as the first color film layer, the second sub-layer is provided in a same layer as the second color film layer, and the third sub-layer is provided in a same layer as the third color film layer.

9. The display substrate according to claim 8, wherein the display region comprises a plurality of pixel units,
each of the pixel units comprises the first color film layer, the second color film layer, and the third color film layer,
in each of the pixel units, the first color film layer is located between the second color film layer and the third color film layer, the first color film layer and the second color film layer do not overlap at least partially, the first color film layer and the third color film layer do not overlap at least partially, and the second color film layer and the third color film layer do not overlap at all,
the second color film layer of at least one pixel unit partially covers the third color film layer of an adjacent pixel unit; and
wherein, in each of the pixel units, the second color film layer partially covers the first color film layer to form a first overlap region, the third color film layer partially covers the first color film layer to form a second overlap region, and both the first overlap region and the second overlap region have a function of blocking light.

10. The display substrate according to claim 9, wherein, in the display region, the first color film layer, the second color film layer, and the third color film layer are arranged in an array; and in the peripheral region, the black matrix has a ring-shaped pattern.

11. The display substrate according to claim 10, further comprising a filling material and a cover plate provided on a side of the color film layer away from the base substrate; and
wherein a material of the base substrate is a silicon-based material.

12. A preparation method of a color film layer, the color film layer comprises a plurality of repeating units, and forming each of the repeating units comprises:
forming a first color film; and
after forming the first color film layer, forming a second color film layer partially covering the first color film layer;
wherein adhesion of the first color film layer is greater than adhesion of the second color film layer;
the first color film layers of the plurality of repeating units are formed in a same patterning process, the second color film layers of the plurality of repeating units are formed in a same patterning process, and the third color film layers of the plurality of repeating units are formed in a same patterning process.

13. The preparation method according to claim 12, further comprising:
after forming the first color film layer and before forming the second color film layer, forming a third color film layer, wherein the third color film layer partially covers the first color film layer, the second color film layer partially covers the third color film layer; adhesion of the third color film layer is greater than the adhesion of the second color film layer and less than the adhesion of the first color film layer;
wherein air permeability of the second color film layer is greater than air permeability of the first color film layer; and wherein air permeability of the third color film layer is greater than the air permeability of the first color film layer and less than the air permeability of the second color film layer.

14. The preparation method according to claim 13, wherein the first color film layer is a green film layer, the second color film layer is a blue film layer, and the third color film layer is a red film layer; and
wherein a material of the first color film layer comprises a base material and a first color material; a material of the second color film layer comprises the base material and a second color material; and a material of the third color film layer comprises the base material and a third color material.

15. The preparation method according to claim 14, wherein the base material comprises propylene glycol monomethyl ether ester, 3-methoxybutyl acetate and acrylic resin; the first color material comprises $C_{32}Cl_{16}CuN_8$, $C_{16}H_{11}N_5O_4$ and auxiliary green pigment; the second color material comprises 2-butanone, phthalocyanine blue and auxiliary blue pigment; and the third color material comprises 2-butanone, $C_{28}H_{16}N_2O_4$, $C_{16}H_9N_5O_6$ and auxiliary red pigment; and
wherein, by mass percentage,
the material of the first color film layer comprises 50 wt %~60 wt % propylene glycol monomethyl ether ester, 20 wt %~25 wt % 3-methoxybutyl acetate, 1 wt %~10 wt % acrylic resin, 5 wt %~11 wt % $C_{32}Cl_{16}CuN_8$, 3 wt %~10 wt % $C_{16}H_{11}N_5O_4$, and 1 wt %~10 wt % auxiliary green pigment,
the material of the second color film layer comprises 60 wt %~75 wt % propylene glycol monomethyl ether ester, 9 wt %~14 wt % 3-methoxybutyl acetate, 5 wt %~10 wt % acrylic resin, 0.05 wt %~0.5 wt % 2-butanone, 3 wt %~10 wt % phthalocyanine blue, and 1 wt %~10 wt % auxiliary blue pigment, and the material of the third color film layer comprises 60 wt %~70 wt % propylene glycol monomethyl ether ester, 10 wt %~30 wt % 3-methoxybutyl acetate, 2 wt %~10 wt % acrylic resin, 0.05 wt %~0.5 wt % 2-butanone, 2 wt %~10 wt % $C_{28}H_{16}N_2O_4$, 0.5 wt %~3 wt % $C_{16}H_9N_5O_6$, and 1 wt %~10 wt % auxiliary red pigment.

16. The preparation method according to claim 15, wherein viscosity of the material of the first color film layer is 8.1 mPa·s to 9.0 mPa·s, and viscosity of the material of the second color film layer is 7.5 mPa·s to 8.0 mPa·s, and viscosity of the material of the third color film layer is 4 mPa·s~4.6 mPa·s;

wherein the viscosity of the material of the first color film layer is 8.4 mPa·s, the viscosity of the material of the second color film layer is 7.8 mPa·s, and the viscosity of the material of the third color film layer is 4.4 mPa·s; and wherein areas of the first color film layer, the second color film layer, and the third color film layer are all less than 20 µm$^2$; and a preparation temperature of the first color film layer, the second color film layer, and the third color film layer is less than 90° C.

17. The preparation method according to claim 16, further comprising: forming the first color film, the second color film, and the third color film by a spin coating process, and then forming the first color film layer, the second color film layer, and the third color film layer by performing a patterning process on the first color film, the second color film, and the third color film, respectively.

18. A preparation method of a display substrate, comprising:

providing a base substrate;

forming a light-emitting element on the base substrate; and forming a color film layer on a side of the light-emitting element away from the base substrate by the preparation method according to claim 12.

19. The preparation method according to claim 18, further comprising, before forming the color film layer, forming a passivation layer on a side of the light-emitting element away from the base substrate; after forming the color film layer, sequentially forming a filling material and a cover plate on a side of the color film layer away from the base substrate; and wherein a material of the base substrate is a silicon-based material.

* * * * *